(12) United States Patent  
Wen et al.

(10) Patent No.: US 11,417,542 B2  
(45) Date of Patent: Aug. 16, 2022

(54) SEMICONDUCTOR PROCESSING APPARATUS AND METHOD

(71) Applicant: Wuxi Huaying Microelectronics Technology Co., Ltd, Wuxi (CN)

(72) Inventors: Sophia Wen, Wuxi (CN); Zhikai Wang, Wuxi (CN)

(73) Assignee: Wuxi Huaying Microelectronics Technology Co., Ltd, Wuxi (CN)

( * ) Notice: Subject to any disclaimer, the term of this patent is extended or adjusted under 35 U.S.C. 154(b) by 113 days.

(21) Appl. No.: 16/848,011

(22) Filed: Apr. 14, 2020

(65) Prior Publication Data

US 2020/0243349 A1     Jul. 30, 2020

Related U.S. Application Data

(62) Division of application No. 15/779,519, filed as application No. PCT/CN2016/076717 on Mar. 18, 2016, now Pat. No. 11,101,148.

(30) Foreign Application Priority Data

Nov. 25, 2015    (CN) .......................... 201510828929.8

(51) Int. Cl.
    *H01L 21/67*     (2006.01)
    *H01L 21/02*     (2006.01)
    (Continued)

(52) U.S. Cl.
    CPC ............ *H01L 21/6704* (2013.01); *B08B 3/08* (2013.01); *H01L 21/02* (2013.01);
    (Continued)

(58) Field of Classification Search
    CPC . H01L 21/6719; H01L 21/67; H01L 21/6704; H01L 21/67028; H01L 21/67017;
    (Continued)

(56) References Cited

U.S. PATENT DOCUMENTS 7,566,365 B2 * 7/2009 Kobayashi ............ B05D 1/005
                                                    118/319
2002/0062848 A1    5/2002   Luscher et al.
(Continued)

FOREIGN PATENT DOCUMENTS

CN         1766159 A     5/2006
CN       101499407 A     8/2009
(Continued)

OTHER PUBLICATIONS

International Search Report and Written Opinion received for International Application No. PCT/CN2016/076717 dated Sep. 1, 2016, pp. 12 including 5 pages of English translation.
(Continued)

*Primary Examiner* — Benjamin L Osterhout
(74) *Attorney, Agent, or Firm* — EcoTech Law Group, P.C.

(57) ABSTRACT

A semiconductor processing apparatus is provided. The apparatus includes a body portion, which includes at least one semiconductor processing unit. Each semiconductor processing unit includes a recess formed on an upper surface of the body portion, wherein a bottom surface of the recess has at least one location and a peripheral. The bottom surface ascends from the at least one location toward the peripheral against a direction of gravity or descends from the at least one location toward the peripheral following the direction of gravity. Each semiconductor processing unit also includes a first channel that connects to the recess at the at least one location, as well as at least one second channel connecting to the recess at the peripheral. Each of the first channel and the at least one second channel serves as an inlet or an outlet via which a fluid enters or exits the recess. A method according to the present disclosure may control a flowing direction of a fluid flowing across a substrate surface. When the fluid flow as programmed, the fluid may contact the (Continued)

substrate surface and process the surface via various physical and/or chemical reactions.

16 Claims, 11 Drawing Sheets

(51) Int. Cl.
*H01L 21/66* (2006.01)
*B08B 3/08* (2006.01)

(52) U.S. Cl.
CPC ........ *H01L 21/02238* (2013.01); *H01L 21/67* (2013.01); *H01L 21/67017* (2013.01); *H01L 21/6719* (2013.01); *H01L 21/67023* (2013.01); *H01L 21/67028* (2013.01); *H01L 21/67051* (2013.01); *H01L 21/67057* (2013.01); *H01L 22/20* (2013.01)

(58) Field of Classification Search
CPC ... H01L 21/02; H01L 21/67051; H01L 22/20; H01L 21/67023; H01L 21/02238; H01L 21/67057; B08B 3/08
See application file for complete search history.

(56) References Cited

U.S. PATENT DOCUMENTS

| | | | |
|---|---|---|---|
| 2002/0189638 | A1 | 12/2002 | Luscher et al. |
| 2004/0084143 | A1* | 5/2004 | Ivanov .................... B24B 49/14 156/345.11 |
| 2009/0241998 | A1 | 10/2009 | Kesil et al. |
| 2015/0079802 | A1 | 3/2015 | Wen |
| 2015/0345022 | A1* | 12/2015 | Yudovsky ........... H01L 21/0228 438/14 |

FOREIGN PATENT DOCUMENTS

| | | |
|---|---|---|
| JP | 2015-126013 A | 7/2015 |
| KR | 1020150119307 A | 10/2015 |
| WO | 2014130672 A1 | 8/2014 |

OTHER PUBLICATIONS

European Search Report received for EP Application No. 16867553.6, mailed on Oct. 23, 2018, 7 pages.

Japan Written Opinion received for Japan Patent Application No. 2018-527212, mailed on Oct. 29, 2019, 3 pages of English translation.

* cited by examiner

US 11,417,542 B2

SEMICONDUCTOR PROCESSING APPARATUS AND METHOD

RELATED APPLICATION

This application is a divisional of patent application Ser. No. 15/779,519, filed on May 26, 2018 which claims the benefit from International Application No. PCT/CN2016/076717, which was granted an International filing date of Mar. 18, 2016, which in turns claims priority from CN Application having Serial No. 201510828929.8 filed on Nov. 25, 2015, which are incorporated herein by reference for all purposes.

TECHNICAL FIELD

The present disclosure generally relates to semiconductor technology and, more particularly, to a semiconductor processing apparatus and a method thereof.

BACKGROUND

A surface of a semiconductor wafer substrate (referred to as a "substrate surface" hereinafter) is very sensitive to micro contaminants that are on the surface. In order to obtain a qualified substrate surface, it is required to remove the micro contaminants from the surface and subsequently to prevent the micro contaminants from reattaching to the surface after being removed. This requires the substrate surface to go through several rounds of cleaning steps in order to remove any metallic ions, atoms, organic substances and microparticles that may be on the substrate surface. Existing substrate surface cleaning techniques fall into two major categories: wet cleaning and dry cleaning, with the former being the mainstream techniques. Wet cleaning techniques involve washing a substrate surface using a mixture of a liquid acid or base solution and deionized water, followed by rinsing and drying procedures. Regarding substrate surface cleaning used in industrial production, a semiconductor wafer may be processed or otherwise treated by being immersed in various processing fluids in sequence. Alternatively, each of the processing fluids may be sprayed onto a semiconductor wafer that is spinning. Either way, the processing fluids may cause various physical and/or chemical reactions with the substrate surface of the semiconductor wafer, thereby producing a substrate surface that meets processing requirements. Wet cleaning and dry cleaning alike demand a rather large amount of ultrapure chemical solutions and/or gases, which become wasted fluids that are to be disposed after processing. The large amount of ultrapure chemical solutions and/or gases consumed contribute to a high cost of the cleaning process, and the post-processing expenses of the wasted fluids raise the cost even higher, not to mention disadvantageous environmental impacts the wasted fluids may cause.

Methods and new techniques have been sought after by semiconductor manufacturing engineers to reduce consumption of chemicals for the cleaning process, which would reduce the processing cost as well as the post-processing expenses of the wasted fluids. A reduction in the consumption of chemicals would also make the cleaning process safer and less harmful to the environment. Chinese patent application CN103367197A discloses a substrate surface processing system that is able to effectively reduce the amount of chemicals or fluids consumed by a wet cleaning process for a semiconductor substrate surface, and also able to perform in-situ recycling and post-processing of the used fluids. Specifically, the substrate surface processing system includes a processing unit having a micro chamber for a semiconductor silicon wafer. The micro chamber includes an upper chamber portion and a lower chamber portion, similar to those shown in FIG. 1. When the upper chamber portion and the lower chamber portion are in a closed position, they form the micro chamber that is closed. The semiconductor wafer, namely, a substrate, may be placed inside the closed micro chamber, and processing to either an upper or a lower surface of the substrate may be performed by sending a processing fluid (liquid or gas) into the micro chamber. It is apparent that a flowing pattern of the processing fluid flowing inside the micro chamber, a length of period the processing fluid staying inside the micro chamber, and how the processing fluid contacts the upper or lower surface of the substrate will all directly affect the result of the surface processing. As the processing fluid may flow on the upper or lower surface of the substrate in a random fashion, the result of the surface processing may not be highly repeatable. Therefore, in order to achieve repeatable result for the surface processing, a method and/or a design is necessary that enables accurate control of the flowing of the processing fluid inside the micro chamber.

SUMMARY

A purpose of the present disclosure is to provide a semiconductor processing apparatus and method, via which an accurate control of a flowing direction of a processing fluid may be achieved, thereby controlling a process and a result of the processing fluid processing a substrate surface.

Specifically, the present disclosure discloses the following:

A semiconductor processing apparatus has a body portion that includes at least one semiconductor processing unit. Each of the at least one semiconductor processing unit may include a recess formed on an upper surface of the body portion. A bottom surface of the recess may have at least one location and a peripheral. The bottom surface ascends from the at least one location toward the peripheral against a direction of gravity or descends from the at least one location toward the peripheral following the direction of gravity. Each of the at least one semiconductor processing unit may also include a first channel connecting to the recess at the at least one location. Each of the at least one semiconductor processing unit may also include at least one second channel connecting to the recess at the peripheral. Each of the first channel and the at least one second channel serves as an inlet or an outlet via which a fluid enters or exits the recess.

Preferably, the at least one location is located at a center of the bottom surface.

Preferably, the at least one semiconductor processing unit comprises one semiconductor processing unit, and the bottom surface comprises a sloped surface ascending from the at least one location toward the peripheral against the direction of gravity.

Preferably, the at least one semiconductor processing unit comprises one semiconductor processing unit, and the bottom surface comprises a sloped surface descending from the at least one location toward the peripheral following the direction of gravity.

Preferably, a guiding trench is disposed at the peripheral of the bottom surface, and the guiding trench is connected to the at least one second channel.

Preferably, the at least one second channel comprises a plurality of second channel, and the plurality of second channels are distributed in a circle surrounding the center of the bottom surface of the recess.

Preferably, the body portion also includes a groove disposed on an outer side of the at least one semiconductor processing unit, the groove capable of collecting the fluid overflowing from the recess. Preferably, the body portion further includes a third channel connecting the groove and an external environment, the third channel capable of sending out the fluid collected by the groove.

Preferably, the at least one semiconductor processing unit comprises one semiconductor processing unit, and the bottom surface ascends from the at least one location toward the peripheral against the direction of gravity. Moreover, the bottom surface comprises a cross sectional profile described by a curve. The curve has a slope varying from a larger value to a smaller value as the bottom surface ascends.

Preferably, the at least one semiconductor processing unit comprises one semiconductor processing unit, and the bottom surface descends from the at least one location toward the peripheral following the direction of gravity. Moreover, the bottom surface comprises a cross sectional profile described by a curve. The curve has a slope varying from a smaller value to a larger value as the bottom surface descends.

Preferably, the curve is represented by a function $y=-C/x$, wherein C is a constant greater than 0, wherein the center is an origin of the function, and wherein a direction extending from the center toward the peripheral is a positive direction of a variable x of the function.

Preferably, the curve is represented by a function $y=A\cdot \ln(x)+C$, wherein each of A and C is a constant, wherein the center is an origin of the function, and wherein a direction extending from the center toward the peripheral is a positive direction of a variable x of the function.

Preferably, the semiconductor processing apparatus also includes a cover portion disposed on top of the body portion. The cover portion includes a fourth channel, wherein a chamber is formed between the recess of the body portion and a lower surface of the cover portion, and wherein the fourth channel connects the chamber to an external environment.

Preferably, the body portion further includes a first engagement feature, and the cover portion further has a second engagement feature that corresponds to the first engagement feature. When the body portion and the cover portion are engaged with one another, the body portion and the cover portion are tightly connected together and seal one another.

Preferably, at least one fluid guiding trench is formed on the lower surface of the cover portion, and is connected to the fourth channel.

Preferably, the at least one semiconductor processing unit comprises a plurality of semiconductor processing units, and each of the semiconductor processing units is capable of processing a respective one region of a surface of a substrate.

A semiconductor processing method may include the following steps: (1) Place a substrate on top of a recess of a body portion, with a lower surface of the substrate facing downward for processing. The body portion has a first channel and a second channel. Each of the first channel and the second channel connects to the recess at a respective opening which is at a respectively different height. (2) Send a fluid to the recess via at least one of the first channel and the second channel, such that the fluid fills up a space between the lower surface of the substrate and the recess and contacts the lower surface of the substrate. (3) Drain the fluid that is inside the recess via one of the first channel and the second channel that has the respective opening located at a lower location.

Preferably, the draining of the fluid inside the recess comprises controlling a moving speed and a moving direction of a solid-liquid-gas boundary. The solid-liquid-gas boundary is formed between the fluid and the lower surface of the substrate. This would control an amount and a physical distribution of a residue of the fluid that is left at the lower surface of the substrate after the draining.

Preferably, when the moving speed of the solid-liquid-gas boundary satisfies a first predetermined condition, the fluid leaves substantially no residue on the lower surface of the substrate as the solid-liquid-gas boundary moves across the lower surface of the substrate.

Preferably, when the moving speed of the solid-liquid-gas boundary satisfies a second predetermined condition, the fluid forms a thin film of a predetermined thickness on the lower surface of the substrate as the solid-liquid-gas boundary moves across the lower surface of the substrate.

Preferably, a bottom surface of the recess descends from a center of the bottom surface toward a peripheral of the bottom surface following a direction of gravity. The first channel has the respective opening at a higher location, and the second channel has the respective opening at a lower location.

Preferably, during the draining of the fluid inside the recess, the solid-liquid-gas boundary moves from the center of the bottom surface toward the peripheral of the bottom surface.

Preferably, a bottom surface of the recess ascends from a center of the bottom surface toward a peripheral of the bottom surface against a direction of gravity. The first channel has the respective opening at a lower location, and the second channel has the respective opening at a higher location.

Preferably, during the draining of the fluid inside the recess, the solid-liquid-gas boundary moves from the peripheral of the bottom surface toward the center of the bottom surface.

A semiconductor surface inspection method may include the following steps: (1) Place a substrate on top of a body portion such that each of a plurality of semiconductor processing units abuts a lower surface of the substrate. (2) Send a fluid to at least one unit of the plurality of semiconductor processing units via either a first channel or a second channel of the at least one unit. The fluid contacts the lower surface of the substrate and removes or dissolves a contaminant at the lower surface of the substrate. (3) Drain the fluid via either one of the first channel and the second channel. (4) Respectively collect and inspect the fluid drained from the at least one unit to obtain a distribution of the contaminant in different regions of the substrate.

Preferably, a bottom surface of a recess of each of the plurality of semiconductor processing units ascends from a center of the bottom surface toward a peripheral of the bottom surface against a direction of gravity. The first channel has a respective opening at a lower location, and the second channel has a respective opening at a higher location. As the fluid flows in the recess, the contaminant removed or dissolved in the fluid moves from the center to the peripheral.

Preferably, the fluid is drained via the first channel, and the contaminant removed or dissolved in the fluid is drained out of the recess along with the fluid, and is subsequently collected for inspection.

Preferably, the fluid is drained via the second channel, and the contaminant removed or dissolved in the fluid is drained out of the recess along with the fluid, and is subsequently collected for inspection.

Preferably, a bottom surface of a recess of each of the plurality of semiconductor processing units descends from a center of the bottom surface toward a peripheral of the bottom surface following a direction of gravity. The first channel has a respective opening at a higher location, and the second channel has a respective opening at a lower location.

Preferably, the fluid is drained via the first channel, and the contaminant removed or dissolved in the fluid is drained out of the recess along with the fluid, and is subsequently collected for inspection.

Preferably, the fluid is drained via the second channel, and the contaminant removed or dissolved in the fluid is drained out of the recess along with the fluid, and is subsequently collected for inspection.

The apparatuses and methods revealed in the present disclosure may exhibit at least the following advantages and benefits: Through choosing a kind of a fluid, a location of an inlet and an outlet via which the fluid is sent into and out of a recess, an internal structure of the recess, as well as a pressure of the fluid, one may control a flowing direction and a flowing speed of the fluid such that the fluid may flow in the recess according to a plan and contact with a surface of a substrate. The fluid may thus process or otherwise treat the surface of the substrate via various physical and/or chemical reactions. That is, through a careful and detailed design of the recess, with an aid of gravity, one may accurately control the flowing direction and speed of the fluid as the fluid flow inside the recess. This would in turn control the physical and/or chemical reactions, and thus a result of processing the surface of the substrate at various locations of the surface. For example, some specific design of a structure or profile of the recess may enable the fluid to flow in the recess and contact the surface of the substrate with a constant linear speed, which may give a uniform processing result of the surface.

BRIEF DESCRIPTION OF THE DRAWINGS

The drawings are intended to assist in understanding the present disclosure as described below but not to limit a scope of the present disclosure in any way. Shape, size and scale of each physical part of the drawings are for illustrative purposes only, meant to assist in understanding the present disclosure but not to specifically limit or define a shape, size or scale of any physical part according to the present disclosure. One having ordinary skills in the art may realize various embodiments according to the present disclosure using any shape, size and scale of the parts that are suitable for a specific application or situation.

Figure 1:
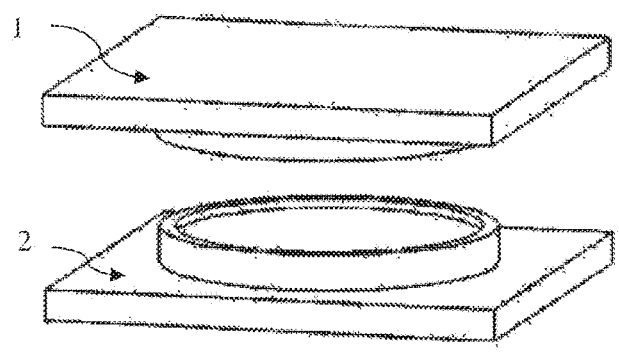
FIG. 1 illustrates a micro chamber processing apparatus.

The numeral references labeled in the drawings are as follows:

1 is a body portion; 11 is a semiconductor processing unit; 111 is a recess; 1111 is a location; 1112 is a peripheral; 112 is a first channel; 113 is a second channel; 114 is a guiding trench; 12 is a first groove; 13 is a third channel; 14 is a first engagement feature; 2 is a cover portion; 21 is a fourth channel; 22 is a second engagement feature; 23 is a fluid guiding trench; 24 is a second groove; 25 is a fifth channel; 3 is a fluid; 4 is a substrate.

DETAILED DESCRIPTION OF THE PREFERRED EMBODIMENTS

To make the above objects, features and advantages of the present disclosure more obvious and easier to understand, the present disclosure is further described in detail below using various embodiments as described below. The embodiments are intended to explain various aspects of the present disclosure as described below but not to be understood in any way as limiting realizations of the present disclosure. Based on the present disclosure, one having ordinary skills in the art may construct various alternative embodiments, which should be deemed within the scope of the present disclosure.

Figure 2:
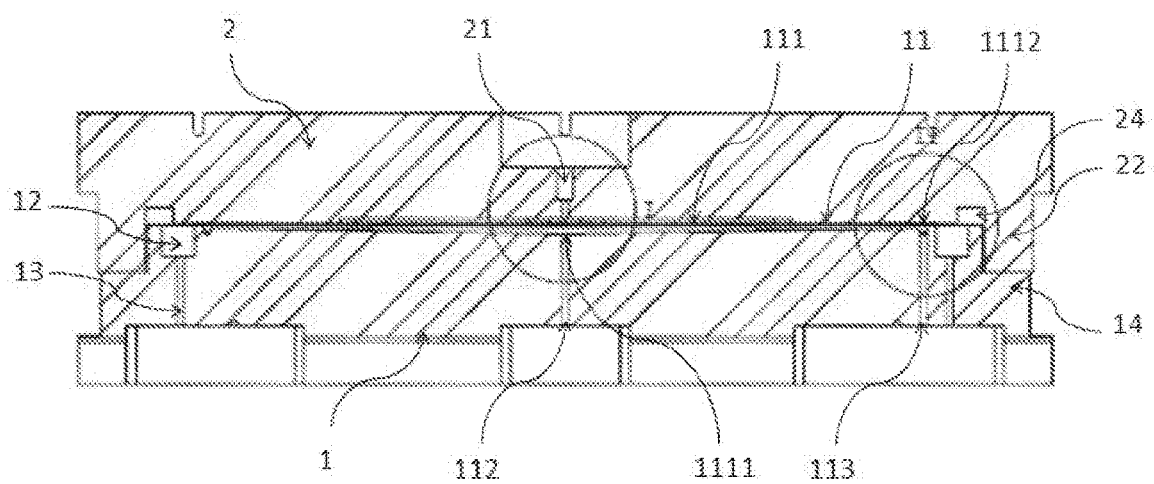
FIG. 2 is a sectional view of a semiconductor processing apparatus according to an embodiment of the present disclosure.
Figure 7:
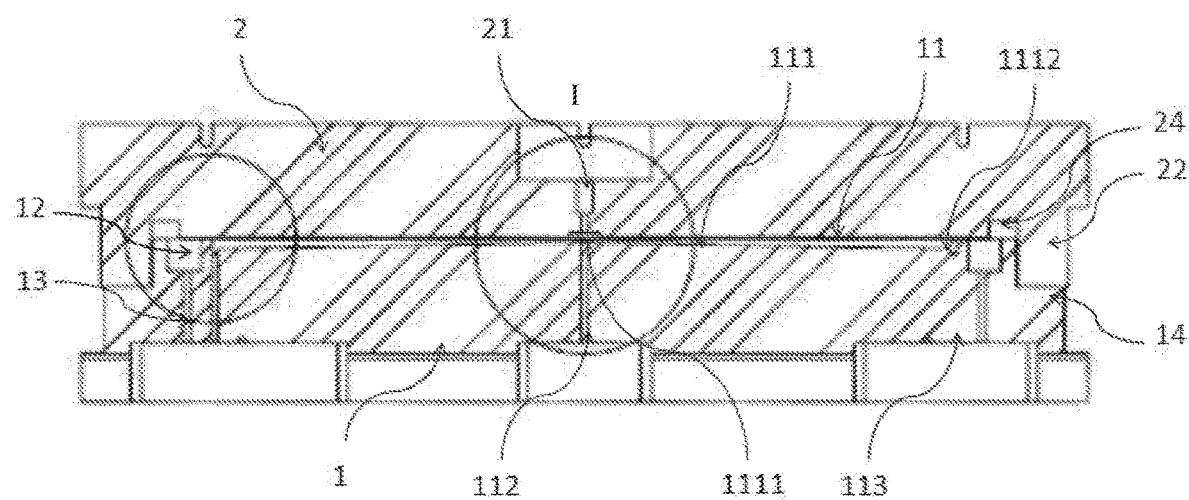
FIG. 7 is a sectional view of a semiconductor processing apparatus according to another embodiment of the present disclosure.

FIG. 2 is a sectional view of a semiconductor processing apparatus according to an embodiment of the present disclosure, whereas FIG. 7 is a sectional view of a semiconductor processing apparatus according to another embodiment of the present disclosure. As shown in each of FIG. 2 and FIG. 7, the semiconductor processing apparatus may include a body portion 1 and a cover portion 2. At least one semiconductor processing unit 11 may be formed on body portion 1, and each of the at least one semiconductor processing unit 11 may have a recess 111 that is formed on an upper surface of body portion 1. A bottom surface of recess 111 may include at least one location 1111. In some embodiments, the bottom surface may descend from location 1111 toward peripheral 1112 of the bottom surface following a direction of gravity. In some embodiments, the bottom surface may ascend from location 1111 toward peripheral 1112 of the bottom surface against the direction of gravity. A first channel 112 that connects to recess 111 may be formed on body portion 1 at location 1111, and a second channel 113 that connects to recess 111 may be formed on body portion 1 at location 1112. First channel 112 and/or second channel 113 may be used as an inlet and/or outlet for a fluid 3.

According to an aspect of the present disclosure, a flowing direction and a flowing speed of fluid 3 over a surface of a substrate 4 may be controlled. Specifically, the flowing direction and the flowing speed may be controlled by one or more of the following parameters: a type or kind of fluid 3, a location of each of the inlet and the outlet which allows fluid 3 to enter or exit recess 111, an internal structure of recess 111, and a pressure of fluid 3. Through controlling the flowing direction and the flowing speed of fluid 3, fluid 3 may flow through recess 111 in a predetermined manner while making contact with the surface of substrate 4 and having various physical and/or chemical reactions with the surface, thereby processing or otherwise treating the surface of substrate 4. Moreover, recess 111 may be carefully designed such that the flowing direction and/or the flowing speed of fluid 3, as driven by gravity and flowing in recess 111, may be accurately controlled. Consequently, the physical and/or chemical reactions that fluid 3 has at various locations of the surface of substrate 4 may be controlled, resulting in a desired treatment of the surface. For example, the structure of recess 111 may be specifically designed such that fluid 3 may move at a predetermined constant linear velocity as it flows through recess 111 and makes contact with various locations of the surface of substrate 4, thereby producing a uniform treatment result.

Figure 2A:
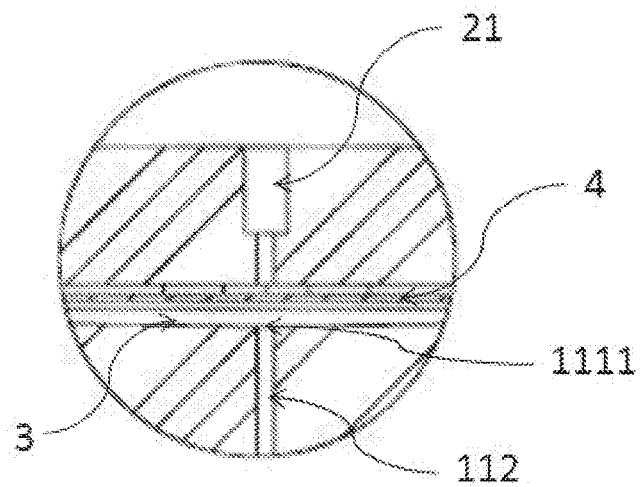
FIG. 2A illustrates a zoom-in view of circle I of FIG. 2.
Figure 2B:
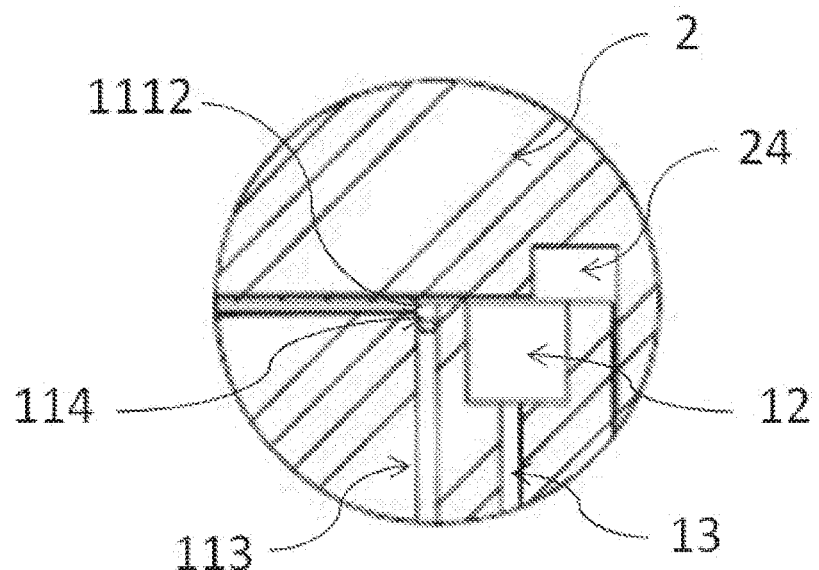
FIG. 2B illustrates a zoom-in view of circle II of FIG. 2.

FIG. 2A illustrates a zoom-in view of circle I of FIG. 2, and FIG. 2B illustrates a zoom-in view of circle II of FIG. 2. As shown in FIGS. 2, 2A and 2B, the semiconductor processing apparatus may include body portion 1, and body portion 1 may include semiconductor processing unit 11, a first groove 12, a third channel 13, and a first engagement feature 14. Semiconductor processing unit 11 may include recess 111 that is formed on the upper surface of body 1, first channel 112 that connects to an internal area of recess 111, second channel 113 that connects to a peripheral area of recess 111. Recess 111 may include location 1111 that is located on the bottom surface of recess 111 where first channel 112 connects to recess 111, as well as location 1112 where second channel 113 connects to recess 111. The bottom surface may ascend from location 1111 toward peripheral 1112 against the direction of gravity. Fluid 3 may simultaneously enter or exit recess 111 via both first channel 112 and second channel 113. Alternatively, fluid 3 may enter/exit recess 111 via first channel 112 and exit/enter recess 111 via second channel 113, respectively.

Figure 3:
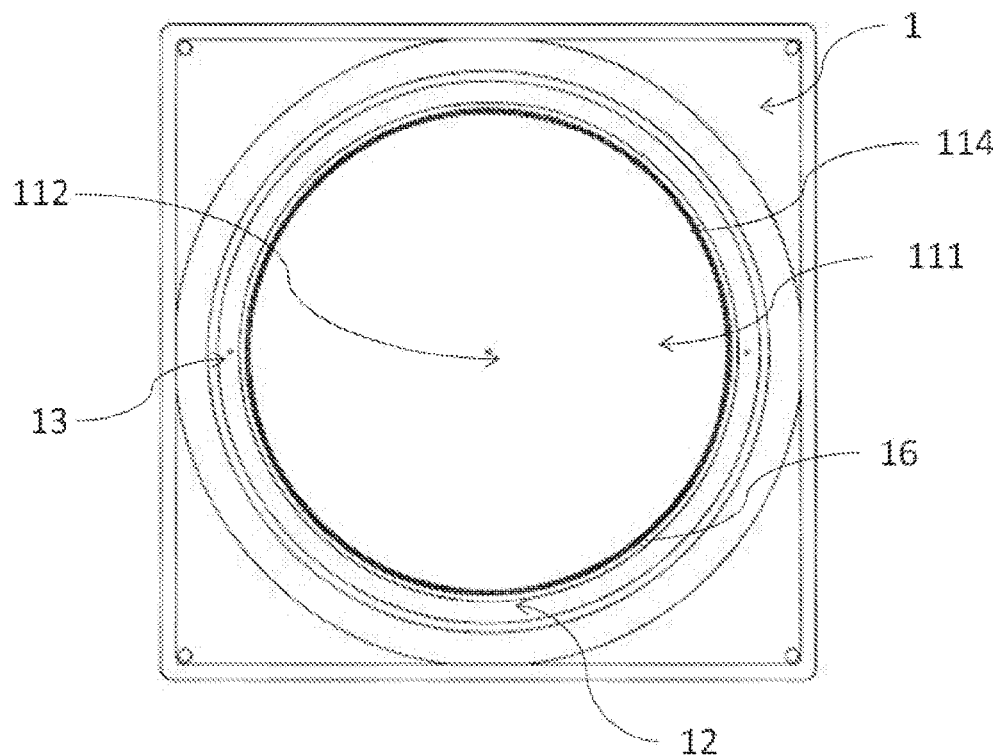
FIG. 3 is a top view of a body portion of a semiconductor processing apparatus according to an embodiment of the present disclosure.
Figure 4:
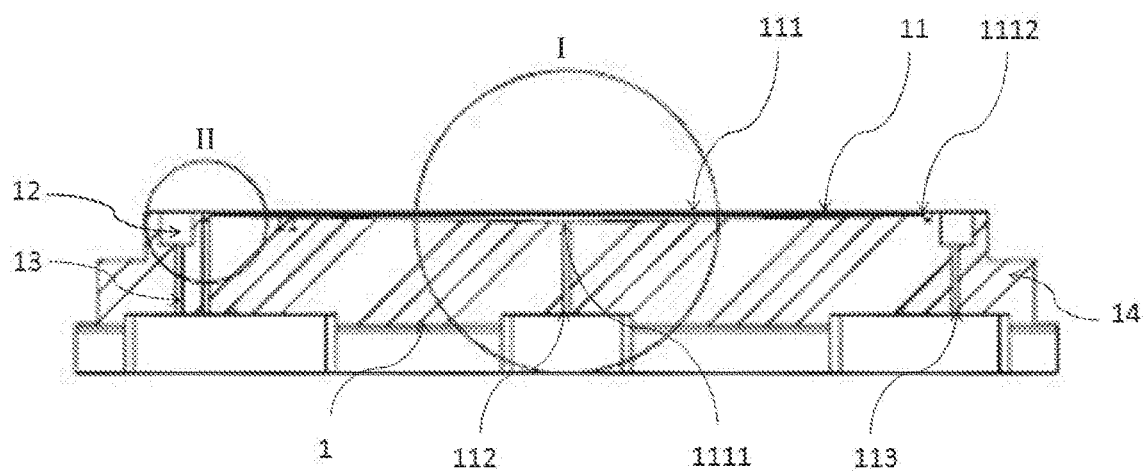
FIG. 4 is a sectional view of a body portion of a semiconductor processing apparatus according to an embodiment of the present disclosure.
Figure 4A:
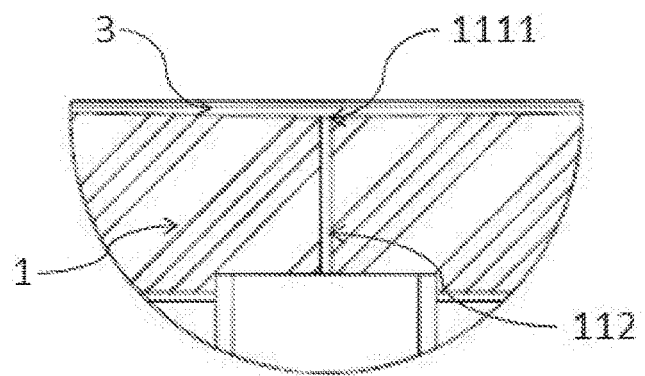
FIG. 4A illustrates a zoom-in view of circle I of FIG. 4.
Figure 4B:
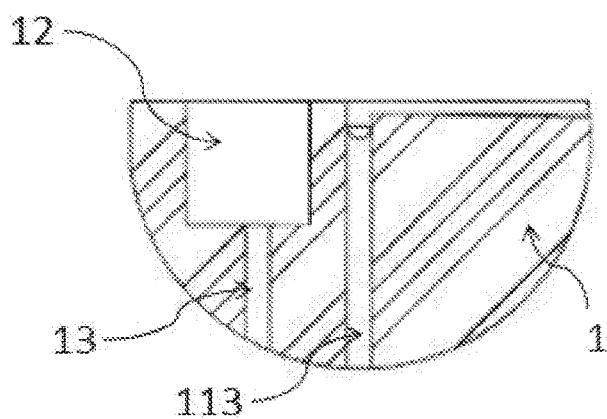
FIG. 4B illustrates a zoom-in view of circle II of FIG. 4.

FIG. 3 is a top view of a body portion of a semiconductor processing apparatus according to an embodiment of the present disclosure, and FIG. 4 is a sectional view of a body portion of a semiconductor processing apparatus according to an embodiment of the present disclosure. In addition, FIG. 4A illustrates a zoom-in view of circle I of FIG. 4, whereas FIG. 4B illustrates a zoom-in view of circle II of FIG. 4. As shown in FIG. 3, body portion 1 may be designed to have an arbitrary shape according a need, and may have a certain thickness which allows the formation of recess 111 therein. In an embodiment, body portion 1 may be in a shape of a rectangular parallelepiped, whereas the upper surface of body portion 1 may be a square. The semiconductor processing apparatus of FIG. 3 may have a recess 111 formed on an upper surface of body portion 1, and recess 111 may be used to accommodate a substrate 4. Recess 111 may have a shape of a cylinder, and may be symmetrical with respect to a center. As shown in FIG. 4, location 1111 of the bottom surface of recess 111 may be located at the center of a bottom surface of recess 111. The bottom surface may be a curved surface that ascends from location 1111 toward peripheral 1112 of the bottom surface against the direction of gravity. In each of various embodiments, the curved surface may have a slope of a respectively different value as it ascends, or a slope of a varying value. In some embodiments wherein the curved surface has a constant slope as it ascends from location 1111 toward peripheral 1112, recess 111 is embodied as a conical surface having an apex pointing downward, as shown in FIG. 4 and FIG. 4A. A first channel 112 may be formed in body portion 1 at location 1111 and connect to recess 111, and a second channel 113 may be formed in body portion 1 at peripheral 1112 and connect to recess 111. That is, first channel 112 may connect to recess 111 at location 1111 which is at the center of the bottom surface of recess 111, and second channel 113 may connect to recess 111 at location 1112 which is at the peripheral of the bottom surface of recess 111. Second channel 113 may connect to one or more guiding trenches 114; guiding trench 114 may be located at peripheral 1112 of the bottom surface of recess 111 and surround location 1111. As fluid 3 flows to or otherwise reach peripheral location 1112 of the bottom surface of recess 111, fluid 3 may enter second channel 113 via guiding trench 113. Thanks to guiding trench 113, fluid 3 may flow evenly in radial directions and enter second channel 113. Fluid 3 may simultaneously enter or exit recess 111 via both first channel 112 and second channel 113. Alternatively, fluid 3 may enter/exit recess 111 via first channel 112 and exit/enter recess 111 via second channel 113, respectively.

As shown in FIGS. 3, 4 and 4B, in some embodiments, body portion 1 may also include a first groove 12 and a first engagement feature 14. First groove 12 may be disposed on an outer side of semiconductor processing unit 11, capable of collecting fluid 3 that overflows from recess 111. First groove may be of a circular shape as disposed on the upper surface of body portion 1. Body portion 1 may further include a third channel 13 that is connected to first groove 12. Third channel 13 may be capable of sending or otherwise drain the fluid 3 collected in the first groove 12 to the outside. Monitoring a flow rate of each of first channel 112, second channel 113 and third channel 13, one may judge whether or not the semiconductor processing apparatus is malfunctioning. First engagement feature 14 may engage with a corresponding feature of the cover portion, thereby sealing the internal chamber from the external environment.

For the immediate embodiment, operation of the semiconductor processing apparatus may be described as follows: Substrate 4 may be placed in a level position on top of recess 111 of body portion 1, with a surface of substrate 4 facing downward toward recess 111 and waiting to be processed. A spacing may thus be formed between the lower surface of substrate 4 and the bottom surface of recess 111. The spacing may decrease in height from central location 1111 toward peripheral location 1112. Fluid 3 may be sent into recess 111 via first channel 112 of body portion 1. As fluid 3 continues being sent into recess 111, fluid 3 may gradually fill up the spacing, starting from central location 1111 and in a direction against the direction of gravity. When the spacing between substrate 4 and body portion 1 is filled by fluid 3, fluid 3 may completely cover the lower surface of substrate 4, i.e., the surface of substrate that needs to be processed. In some embodiments, fluid 3 may continue entering recess 111 via first channel 112, and exit recess 111 via second channel 113. Alternatively, fluid 3 may overflow from recess 111 and into first groove 12, and then flow to the external via third channel 13. At any desired time, fluid 3 may be stopped from further entering recess 111, such that fluid 3 that is already inside the spacing between the lower surface of substrate 4 and recess 111 may stay in the spacing for a predetermined period of processing time, during which fluid 3 may continue having physical and/or chemical reactions with the lower surface of substrate 4. At any desired time, an alternative fluid of another kind may be sent into recess 111 to replace fluid 3 that currently fills the spacing between recess 111 and substrate 4. The process may be repeated using various fluids having same and/or different compositions, until a desired treatment result for the lower surface of substrate 4 is obtained. Fluid inside recess 111 may exit via both first channel and second channel. An entering speed and an exit speed of fluid 3 as it enters and exits recess 111, respectively, may be controlled by adjusting a pressure setting and/or a vacuum setting of gas-liquid pumps.

In the immediate embodiment, a shape of the curved surface of recess 111 may be carefully designed to achieve the desired treatment result. That is, location 1111 may be located at the center of the bottom surface of recess 111, and the bottom surface may be a curved surface ascending from location 1111 toward peripheral 1112 of the bottom surface of recess 111 against the direction of gravity. A curvature or slope of the curved surface may be determined or otherwise defined as part of a design of body portion 1. In the process of fluid 3 flowing from the center of recess 111 toward peripheral 1112 of recess 111, each of a flowing direction of fluid 3, a flowing speed of fluid 3, and a pressure exerted on the lower surface of substrate 4 by fluid 3 may vary depending on the specific shape of the curved surface, which may subsequently affect the result of the processing of the lower surface of substrate 4 due to the physical and/or chemical reactions.

With a similar principle, the semiconductor processing apparatus may alternatively send fluid 3 into recess 111 via second channel 113 which connects to peripheral 1112 of recess 111. That is, fluid 3 may initially emerge at peripheral 1112 of recess 111, and then flow toward central location 1111 along the bottom surface of recess 111 due to gravity given that the bottom surface of recess 111 is sloped, ascending from central location 1111 of the bottom surface toward peripheral 1112 of the bottom surface in a direction against the direction of gravity. During this process, fluid 3 may contact the lower surface of substrate 4 and process or otherwise treat the lower surface of substrate 4. After fluid 3 fills up the spacing between the lower surface of substrate 4 and recess 111, fluid 3 may start to flow out of body portion 1 via first channel 112, at which moment fluid 3 may, in some embodiments, maintain substrate 4 in a floating state and floating on fluid 3. In some other embodiments, substrate 4 may continue abutting body portion 1. Starting from this moment, fluid 3 may continue exiting via first channel 112 while entering via second channel 113. Since recess 111 is sloped toward the center of recess 111, a flowing direction of fluid 3 may be well controlled after fluid 3 enters recess 111 via second channel 113. That is, fluid 3 may flow toward the center of recess 111 because of gravity. Due to a constant slope of the bottom surface of recess 111 as the bottom surface descends from peripheral 1112 of recess 111 toward the center of recess 111, fluid 3 may flow from peripheral 1112 toward the center of recess 111 at a same flowing speed in all radial directions. Therefore, during the flowing, fluid 3 may contact the lower surface of substrate 4 uniformly in all radial directions. Given that substrate 4 typically has a circular surface, fluid 3 may thus treat the lower surface of substrate 4 uniformly in all radial directions of substrate 4 during the flowing. Namely, various locations of substrate 4 that share a same radial distance may be equally treated or processed by fluid 3. After a desired treatment to the lower surface of substrate 4 is achieved, fluid 3 may be stopped from entering recess 111 via second channel 113, and fluid 3 that is already in recess 111 may flow toward the center of recess 111 and drain via first channel 112. During the draining of fluid 3, a solid-liquid-gas boundary between fluid 3 and substrate 4 may firstly emerge at peripheral 1112 of the bottom surface of recess 111. As fluid 3 continues to exit via first channel 112, the solid-liquid-gas boundary between fluid 3 and substrate 4 may move from a peripheral of substrate 4 toward a center of substrate 4, and continue to move in this direction until fluid 3 is completely separated from substrate 4. In the end, all fluid 3 may completely exit recess 111 via first channel 112. Note that a contact area between fluid 3 and substrate 4, particularly the solid-liquid-gas boundary, is completely controlled during the whole process of draining fluid 3. The solid-liquid-gas boundary may firstly emerge at peripheral 1112 of substrate 4 as a circle. The solid-liquid-gas boundary, while maintaining its circular shape, may gradually move from the peripheral of substrate 4 toward the center of substrate 4, and finally disappear at the center of substrate 4.

Figure 5:
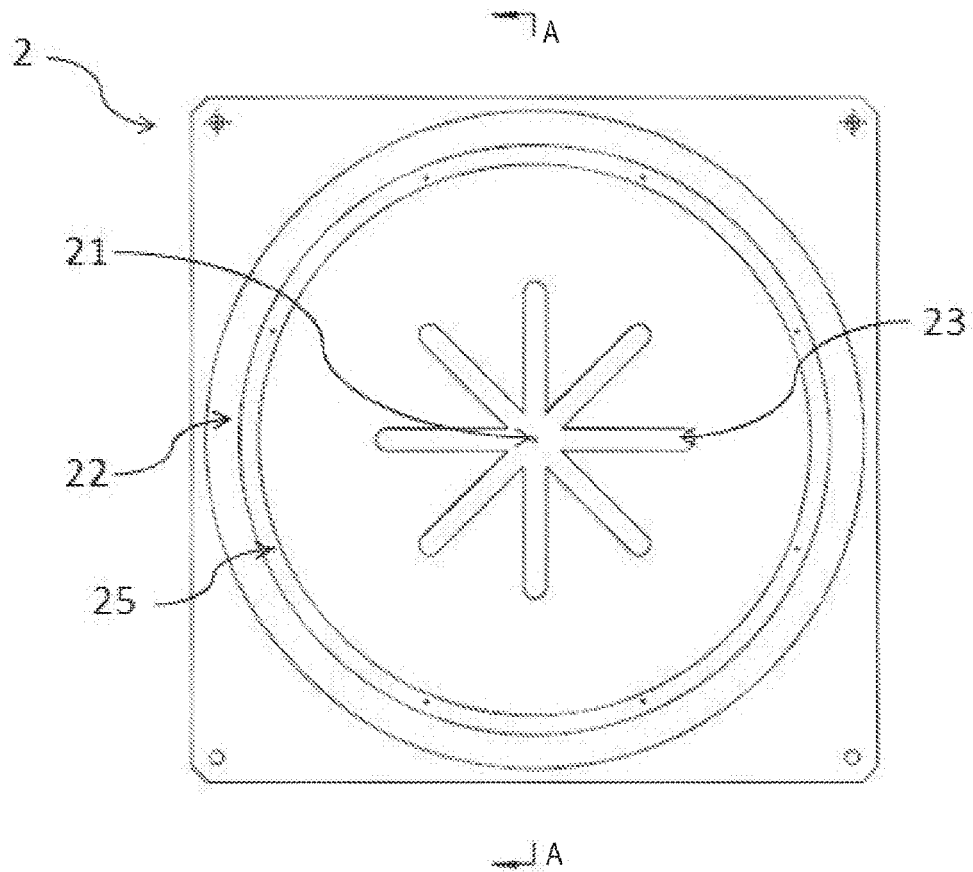
FIG. 5 is a bottom view of a cover portion of a semiconductor processing apparatus according to an embodiment of the present disclosure.
Figure 6:
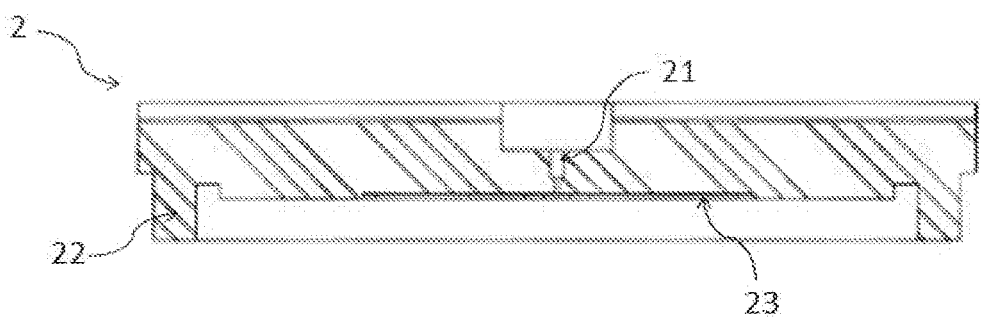
FIG. 6 is a sectional view along sectional line A-A of FIG. 5.

FIG. 5 shows a bottom view of a cover portion 2 of a semiconductor processing apparatus according to an embodiment of the present disclosure, and FIG. 6 is a sectional view along sectional line A-A of FIG. 5. As shown in FIGS. 5 and 6, the semiconductor processing apparatus may include a cover portion 2 disposed above body portion 1. Cover portion 2 may have a fourth channel 21, a fluid guiding trench 23, a fifth channel 25 and a second engagement feature 22. When body portion 1 and cover portion 2 are disposed in a closed position, a closed chamber is formed between recess 111 of body portion 1 (which is located on the upper surface of body portion 1) and a lower surface of cover portion 2. The closed chamber may communicate with an external environment via fourth channel 21. Substrate 4 may be positioned with respect to recess 111 of body portion 1 via cover portion 2. Each of body portion 1 and cover portion 2 may be made of ultrapure and/or corrosion-resistant materials such as polytetrafluoroethylene, quartz, silicon carbide or PPT plastic, capable of handling poisonous and/or corrosive fluid 3 with safety, cleanliness and stability.

In some embodiments, fourth channel 21 may be located at a central location of cover portion 2. A second groove 24 (which may be of a circular shape) and fifth channel 25 that connects to second groove 24 may be located outside of a contact area between cover portion 2 and substrate 4. When body portion 1 and cover portion 2 are disposed in the closed position, second groove 24 of cover portion 2 may be connected with first groove 12 of body portion 1. Fluid may enter and/or exit the closed chamber via fourth channel 21 and fifth channel 25 such that fluid 3 may be introduced to, or drained from, an upper surface and/or a side surface of substrate 4, thereby adjusting a pressure, maintaining a pressure and/or creating a vacuum therein.

As shown in FIGS. 4 and 5, first engagement feature 14 of body portion 1 may correspond to second engagement feature 22 of cover portion 2. When body portion 1 and cover portion 2 are engaged with one another, body portion 1 and cover portion 2 may seal one another and form a closed micro chamber that is sealed from the outside environment. First engagement feature 14 may be located at the peripheral of the upper surface of body portion 1, and may be an indented edge having a circular shape. Second engagement feature 22 may be located at the peripheral of the lower surface of cover portion 2, and may be an extruding edge having a circular shape. When body portion 1 and cover portion 2 are disposed in the closed position, the indented edge of body portion 1 may engage the extruding edge of cover portion 2, thereby ensuring the sealing between body portion 1 and cover portion 2. Apparently, in some other embodiments, first engagement feature 14 may be an extruding edge having a circular shape, whereas second engagement feature 22 may be an indented edge having a circular shape.

As shown in FIG. 5, at least one fluid guiding groove 23 may be provided on the lower surface of cover portion 2, and the at least one fluid guiding groove 23 is connected to fourth channel 21. In some embodiments, the at least one fluid guiding groove 23 may include two guiding grooves that cross one another in an "X" shape. In some embodiments, the at least one fluid guiding groove 23 may include even more guiding grooves that cross each other. Fluid guiding grooves 23 may cross each other at one location or at multiple locations. When fluid guiding grooves 23 cross at one location, the one location may be located at a location where fourth channel 21 is located. In addition, fluid guiding grooves 23 may connect to fourth channel 21 at the one location. Fluid guiding grooves 23 may form a structure that has a center of symmetry. Consequently, when fluid flows via fourth channel 21 to increase or decrease a pressure of the micro chamber formed between body portion 1 and cover portion 2, a change of pressure may be uniformly exerted onto substrate 4. This is because the symmetry of the structure formed by fluid guiding grooves 23 may ensure a uniformity of the fluid flowing in fluid guiding grooves 23. Specifically, when vacuuming via fluid guiding grooves 23, air pressure within fluid guiding grooves 23 is reduced, creating a pressure difference between the upper surface and the lower surface of substrate 4, which is disposed below fluid guiding grooves 23. The pressure difference may force substrate 4 to move upward and abut fluid guiding grooves 23, thereby forming a closed space. As the vacuuming continues, substrate 4 is eventually attached to cover portion 2.

In an embodiment, a semiconductor processing unit 11 may include a recess 111 formed on an upper surface of a body portion 1. Recess 111 may be largely a rectangle, and may have a plurality of locations 1111 on a bottom surface of recess 111. The plurality of locations 1111 may form a straight line, and the bottom surface may ascend, 111 against a direction of gravity, from the straight line toward both of left and right sides of recess. Specifically, the straight line formed by the plurality of locations 1111 may be a line of symmetry of the bottom surface of recess 111, and the bottom surface of recess 111 may include slopes each ascending from the line of symmetry toward either of the left side and right side of recess 111. A shape of recess 111 may be symmetrical with respect to a vertical surface encompassing the line of symmetry. Namely, the bottom surface of recess 111 may have a V-shaped cross section. Furthermore, a plurality of first channels 112 may each connect to a lowest point of the bottom surface of recess 111 to the outside environment. The plurality of first channels 112 may be arranged along the line of symmetry such that fluid 3 may enter recess 111 uniformly along the line of symmetry located on the bottom surface of recess 111. A plurality of second channels 113 may include two rows of channels, each row arranged along a direction of the line of symmetry, each row also connecting either the left side or the right side of recess 111 with the external environment. The semiconductor processing unit of the immediate embodiment may be used to treat or otherwise process a silicon wafer having a rectangular shape. Specifically, fluid 3 may enter recess 111 via the plurality of second channels 113 that are symmetrically arranged on the left side and the right side of recess 111. Due to gravity, fluid 3 may flow uniformly from the left side and the right side of recess 111 toward a lowest location of recess 111. During the flowing, fluid 3 may contact a lower surface of the silicon wafer, thereby processing or treating the lower surface of the silicon wafer. Since fluid 3 flows uniformly from both sides of recess 111 toward the lowest location of recess 111, equally uniform is the processing or treatment to both sides of the lower surface of the silicon wafer. It is obvious that in some other embodiments, the bottom surface of recess 111 may descend from the line of symmetry toward both left and right sides of recess 111. Namely, the bottom surface of recess 111 may have an inverse-V-shaped cross section. The plurality of first channels 112 may each connect a highest point of the bottom surface of recess 111 to the outside environment. The plurality of second channels 113 may include two rows of channels, each row connecting either the left side or the right side of recess 111 and the external environment. Each of the left side and the right side of recess 111 represents a lowest location of recess 111. A silicon wafer having a rectangular shape may be processed or treated by a semiconductor processing unit of the immediate embodiment.

Figure 7A:
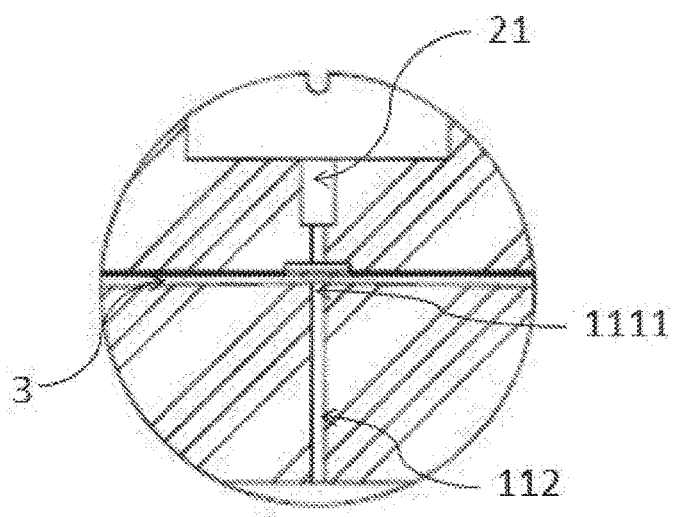
FIG. 7A illustrates a zoom-in view of circle I of FIG. 7.
Figure 8:
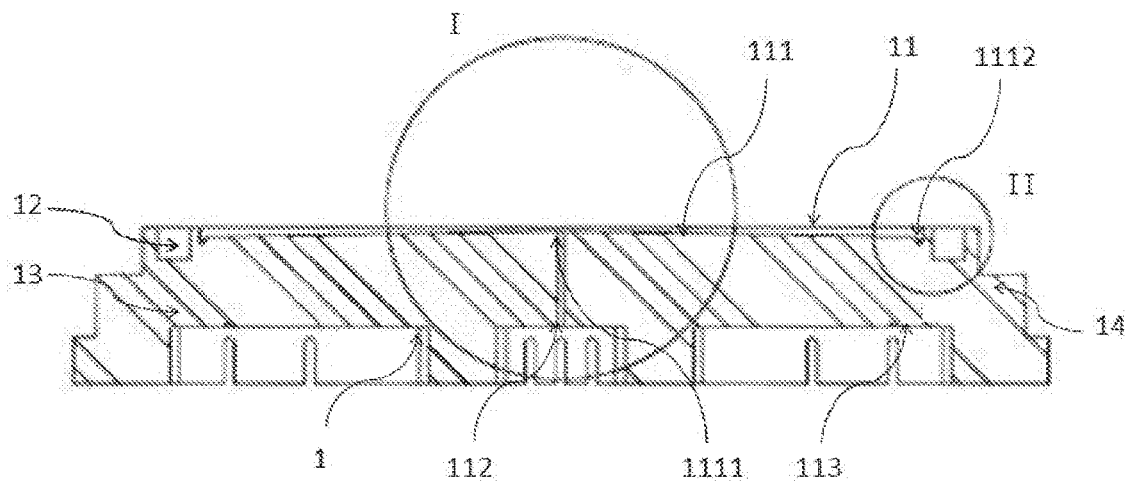
FIG. 8 is a sectional view of a body portion of a semiconductor processing apparatus according to another embodiment of the present disclosure.
Figure 8A:
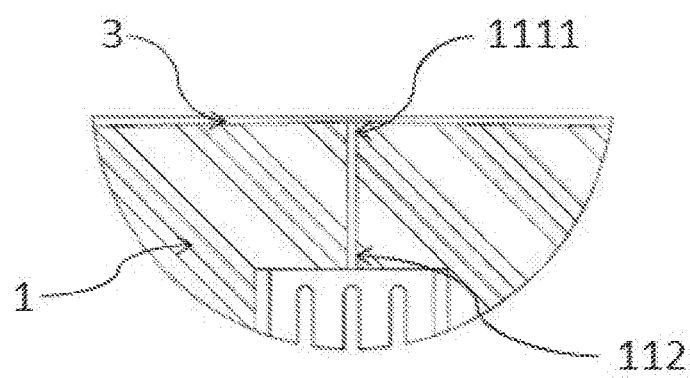
FIG. 8A illustrates a zoom-in view of circle I of FIG. 8.

FIG. 7 is a sectional view of a semiconductor processing apparatus according to another embodiment of the present disclosure, and FIG. 7A illustrates a zoom-in view of circle I of FIG. 7. FIG. 8 is a sectional view of a body portion of a semiconductor processing apparatus according to another embodiment of the present disclosure, and FIG. 8A illustrates a zoom-in view of circle I of FIG. 8. As shown in FIGS. 7 and 7A, the semiconductor processing apparatus capable of processing a substrate 4 may include a body portion 1, and body portion 1 may include a semiconductor processing unit 11. Semiconductor processing unit 11 may include a recess 111 that is formed on body 1 and capable of accommodating substrate 4. Recess 111 may include a location 1111 that is located on a bottom surface of recess 111. The bottom surface may descend from location 1111 toward a peripheral 1112 of the bottom surface of recess 111 following the direction of gravity. At location 1111, body portion 1 may have a first channel 112 that connects recess 111 to an external environment. At peripheral 1112, body portion 1 may further have a second channel 113 that connects recess 111 to the external environment. Fluid 3 may enter or exit recess 111 via either or both of first channel 112 and second channel 113.

Specifically, as shown in FIGS. 8 and 8A, body portion 1 may be in a shape of a rectangular parallelepiped, whereas the upper surface of body portion 1 may be a square. Recess 111 may be formed on an upper surface of body portion 1, capable of accommodating substrate 4. Location 1111 may be located at a center of the bottom surface of recess 111.

The bottom surface may be a sloped surface descending from location 1111 toward peripheral 1112. In some alternative embodiments, the bottom surface may be a curved surface having a descending trend that may or may not vary as the curved surface descends from location 1111 toward peripheral 1112. Recess 111 may be symmetrical around the center of the bottom surface. In some embodiments wherein the curved surface has a constant slope as it descends from location 1111 toward peripheral 1112, the bottom surface of recess 111 is embodied as a conical surface having an apex pointing upward. First channel 112 may be formed in body portion 1 at location 1111 and may connect recess 111 to the external environment, and second channel 113 may be formed in body portion 1 at peripheral 1112 and may connect recess 111 to the external environment. That is, first channel 112 may connect to the center of the bottom surface of recess 111, and fluid 3 may enter recess 111 via first channel 112. In some embodiments, a plurality of second channels 113 may be formed, which are distributed circularly surrounding the center of the bottom surface of recess 111. Fluid 3 may exit recess 111 via the plurality of second channels 113.

Figure 9:
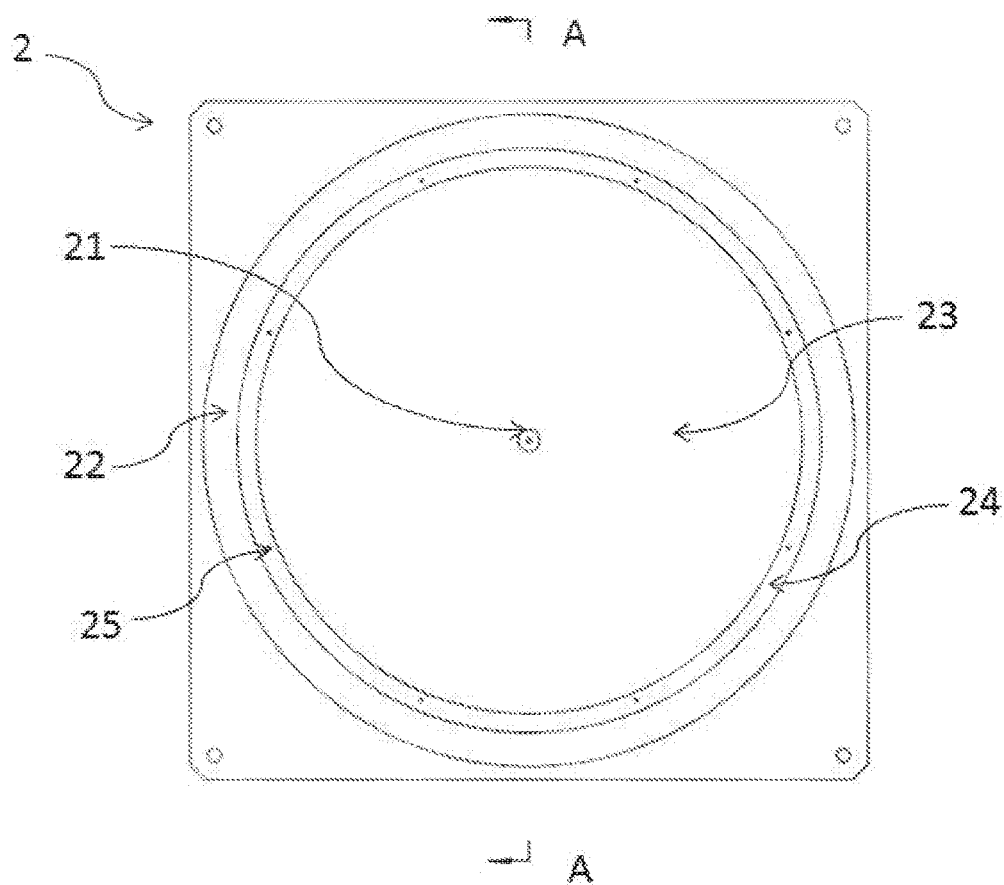
FIG. 9 is a bottom view of a cover portion of a semiconductor processing apparatus according to another embodiment of the present disclosure.
Figure 9A:
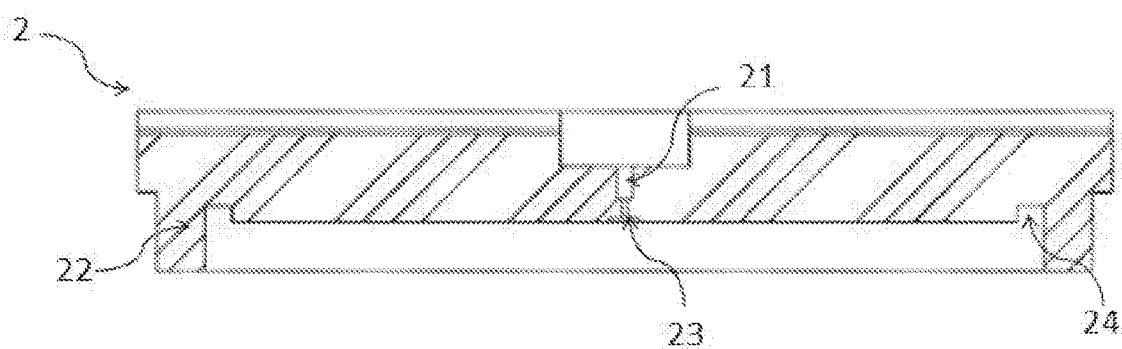
FIG. 9A is a sectional view along sectional line A-A of FIG. 9.

FIG. 9 shows a bottom view of a cover portion 2 of a semiconductor processing apparatus according to an embodiment of the present disclosure, and FIG. 9A is a sectional view along sectional line A-A of FIG. 9. As shown in FIGS. 9 and 9A, cover portion 2 may have a fourth channel 21 formed therein. When body portion 1 and cover portion 2 are disposed in a closed position, a closed chamber is formed between recess 111 of body portion 1 (which is formed on the upper surface of body portion 1) and a lower surface of cover portion 2. The closed chamber may communicate with the external of the closed chamber via fourth channel 21. A second groove 24 (which may be of a circular shape) and a fifth channel 25 that connects second groove 24 to the external environment may be formed on the bottom surface of cover portion 2. When body portion 1 and cover portion 2 are disposed in a closed position, second groove 24 may be connected with first groove 12 of body portion 1. Cover portion 2 may include a second engagement feature 22 that may correspond to first engagement feature 14 of body portion 1. When body portion 1 and cover portion 2 are engaged with one another, body portion 1 and cover portion 2 may be tightly connected together and seal one another.

For the immediate embodiment, operation of the semiconductor processing apparatus may be described as follows: Substrate 4 may be placed in a level position on top of recess 111 of body portion 1. A spacing may thus be formed between the lower surface of substrate 4 and recess 111. The spacing may increase in height from the center of substrate 4 to the peripheral of substrate 4. Fluid 3 may be sent into recess 111 via first channel 112 that connects to the center of recess 111. Initially, fluid 3 may emerge at central location 1111 of recess 111. Since the bottom surface of recess 111 is a sloped surface descending, following the direction of gravity, from central location 1111 of recess 111 toward peripheral 1112 of recess 111, fluid 3 may flow along the bottom surface of recess 111 from central location 1111 toward peripheral 1112 due to gravity. During the flowing, fluid 3 may contact the lower surface of substrate 4 and process or treat the lower surface of substrate 4 via various chemical and physical reactions caused by fluid 3 at the lower surface of substrate 4. After fluid 3 fills up the spacing between substrate 4 and recess 111, fluid 3 may exit recess 111 via second channel 113 of body portion 1. Substrate 4 may either maintain in a floating state under the effect of fluid 3 or abut against body portion 1. Starting from this moment, fluid 3 may continue exiting recess 111 via second channel 113 while entering recess 111 via first channel 112. Since the bottom surface of recess 111 is sloped, a flowing direction of fluid 3 may be well controlled after fluid 3 enters recess 111 via first channel 112. That is, fluid 3 may flow toward peripheral 1112 of the bottom surface of recess 111 because of gravity. Fluid 3 may flow with a same flowing speed in all radial directions of recess 111, and thus contact the lower surface of substrate 4 uniformly in all radial directions during the flowing. Given that substrate 4 typically has a circular surface, fluid 3 may thus treat the lower surface of substrate 4 uniformly in all radial directions of substrate 4 during the flowing. Namely, various locations of the lower surface of substrate 4 that share a same radial distance from the center of recess 111 may be equally treated or processed by fluid 3. After a desired treatment result to the lower surface of substrate 4 is achieved, fluid 3 may be stopped from entering recess 111 via first channel 112, and fluid 3 that is already in recess 111 may flow toward peripheral 1112 of recess 111. A solid-liquid-gas boundary between fluid 3 and substrate 4 may firstly emerge at the center of the bottom surface of recess 111. As fluid 3 continues to exit via second channel 113, the solid-liquid-gas boundary between fluid 3 and substrate 4 may move from a center of substrate 4 toward a peripheral of substrate 4, and continue to move in this direction until fluid 3 is completely separated from substrate 4. In the end, all fluid 3 may completely exit recess 111 via second channel 113. Note that a contact area between fluid 3 and substrate 4, particularly the solid-liquid-gas boundary, is completely controlled during the whole process of draining fluid 3. The solid-liquid-gas boundary may firstly emerge at the center of substrate 4 as a circle. The solid-liquid-gas boundary, while maintaining its circular shape, may gradually enlarge and move from the center of substrate 4 toward the peripheral of substrate 4, and finally disappear at the peripheral of substrate 4. The enlarging and moving of the solid-liquid-gas boundary would not leave residue of fluid 3 at the surface of substrate 4 except for the peripheral of substrate 4, if any. Namely, it is ensured that the residue of fluid 3 would not appear on substrate 4 except for the peripheral of substrate 4. Various chemical and physical reactions between fluid 3 and the lower surface of substrate 4 may cause different results depending on how fluid 3 contacts the lower surface of substrate 4. Therefore, it is apparent that a desired processing quality and result may be achieved through a careful design and manufacturing of recess 111, particularly manifested in detailed calculation of a profile and/or slope of the bottom surface of recess 111 in various embodiments.

In the immediate embodiment, fluid 3 may enter recess 111 via first channel 112, flow from the center of substrate 4 toward the peripheral of substrate 4, and then exit recess 111 via second channel 113 located at the peripheral of the bottom surface of recess 111. Accordingly, when fluid 3 is being drained out of recess 111, the solid-liquid-gas boundary between fluid 3 and substrate 4 may emerge at the center of substrate 4 and gradually move toward the peripheral of substrate 4, and finally disappear at the peripheral of substrate 4.

Figure 10:
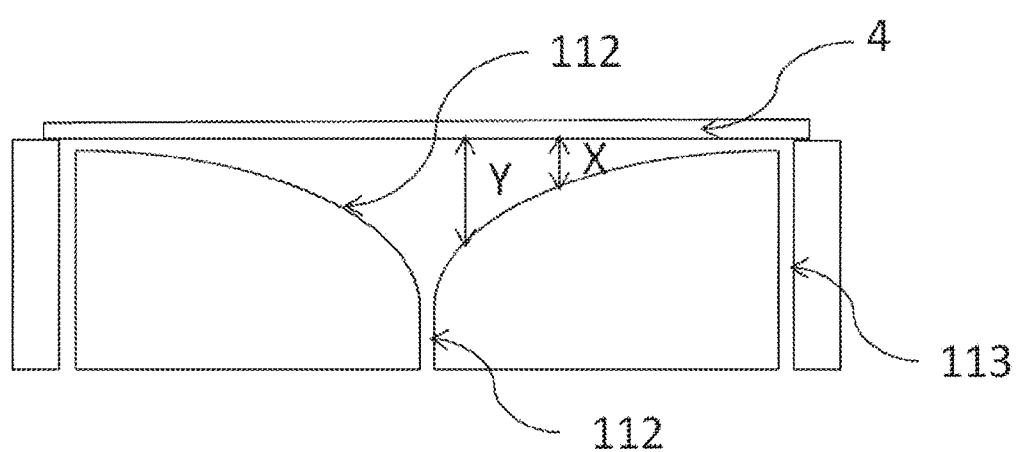
FIG. 10 illustrates structural features of the recess of a semiconductor processing apparatus according to another embodiment of the present disclosure.

FIG. 10 illustrates structural features of recess 111 of a semiconductor processing apparatus according to another embodiment of the present disclosure. As shown in FIG. 10, the bottom surface of recess 111 may include at least a location 1111 that is located at the center of the bottom surface of recess 111. The bottom surface may have a profile of a curve that ascends, against the direction of gravity, from location 1111 toward peripheral 1112 of the bottom surface with a decreasing slope. Recess 111 may have a circular projection shape. A spacing between recess 111 and substrate 4 may be smaller at peripheral 1112 of recess 111, and yet the spacing becomes larger at center 1111 of recess 111. As shown in FIG. 10, the spacing between recess 111 and substrate 4 is smaller at X than that at Y. Fluid 3 may enter recess 111 via first channel 112, which has a lower opening at the connection to recess 10. Initially, fluid 3 is located at center 1111 of recess 111. As a volume of fluid 3 entering recess 111 increases, a level of fluid 3 may gradually move higher (i.e., in a direction against the direction of gravity) and reach peripheral 1112 of the bottom surface, and eventually exit recess 111 via second channel 113 that connects to recess 111 at peripheral 1112 of recess 111. During the process, fluid 3 may initially have a contact area only at a central location of the lower surface of substrate 4, which corresponds to center 1111 of the bottom surface of recess 111. As the volume of fluid 3 entering recess 111 increases, the contact area may enlarge toward a peripheral of substrate 4. When the spacing between substrate 4 and body portion 1 has been filled completely by fluid 3, fluid 3 may completely cover the lower surface of substrate 4. Since this moment, new fluid 3 may continue entering recess 111 via first channel 112, whereas fluid 3 that has contacted the lower surface of substrate 4 may exit recess 111 via second channel 113. Fluid 3 may continually flow over the lower surface of substrate 4 and cause various chemical and physical reactions at the lower surface of substrate 4. A particular way fluid 3 contacts the lower surface of substrate 4, such as an incident angle and a flowing speed thereof, may directly affect a reaction speed and result of the chemical and physical reactions. The structure of recess 111 as shown in FIG. 10 may provide a different diameter at each different height of fluid 3. For example, compared with location X, location Y of FIG. 10 has a smaller diameter with respect to the center of recess 111, but has a larger spacing from substrate 4. As fluid 3 drains toward the center of recess 111 due to gravity, a flowing area of fluid 3 at a specific height of recess 111 equals to a circumference created by the radius of recess 111 at the specific height times the spacing between recess 111 and substrate 4 at the specific height. As long as the spacing increases at a same rate as the circumference decreases, the flowing area at different heights would remain constant. When the flowing area of fluid 3 at different heights remains constant, the flowing speed of fluid 3 at different locations of recess 111 would remain constant at all time. It follows that fluid 3 would process various locations of substrate 4 to a constant extent. Due to the specially designed structure of recess 111, each location of substrate 4 may be processed substantially equally by fluid 3. According to calculations, the curve in FIG. 10 may be described by a function $y=-C/x$, wherein C is a constant of a value greater than 0, an origin of the function coincides with the center of substrate 4, and a positive direction of variable x extends from the center of substrate 4 towards the peripheral of substrate 4. A larger value of constant C may represent a flowing speed of fluid 3 of a smaller constant value across various locations of recess 111, assuming a constant amount of fluid 3 entering and exiting recess 111. On the other hand, a smaller value of constant C may represent a flowing speed of fluid 3 of a larger constant value across various locations of recess 111, also assuming a constant amount of fluid 3 entering and exiting recess 111. In another embodiment, with the same definition of the origin of the function and the positive direction of variable x as defined above, the curve in FIG. 10 may be described by a function $y=A \cdot \ln(x)+C$, wherein each of A and C is a constant. By adjusting the values of A and C, fluid 3 may be controlled to have different values of flowing speed at different locations of recess 111, resulting in a varying flowing speed as fluid 3 flows at various locations of recess 111. For example, in a first scenario, values of A and C may be adjusted such that fluid 3 may have an increasing flowing speed as fluid 3 flows from the center to the peripheral of the lower surface of substrate 4. In a second scenario, values of A and C may be adjusted such that fluid 3 may have a decreasing flowing speed as fluid 3 flows from the center to the peripheral of the lower surface of substrate 4.

Figure 11:
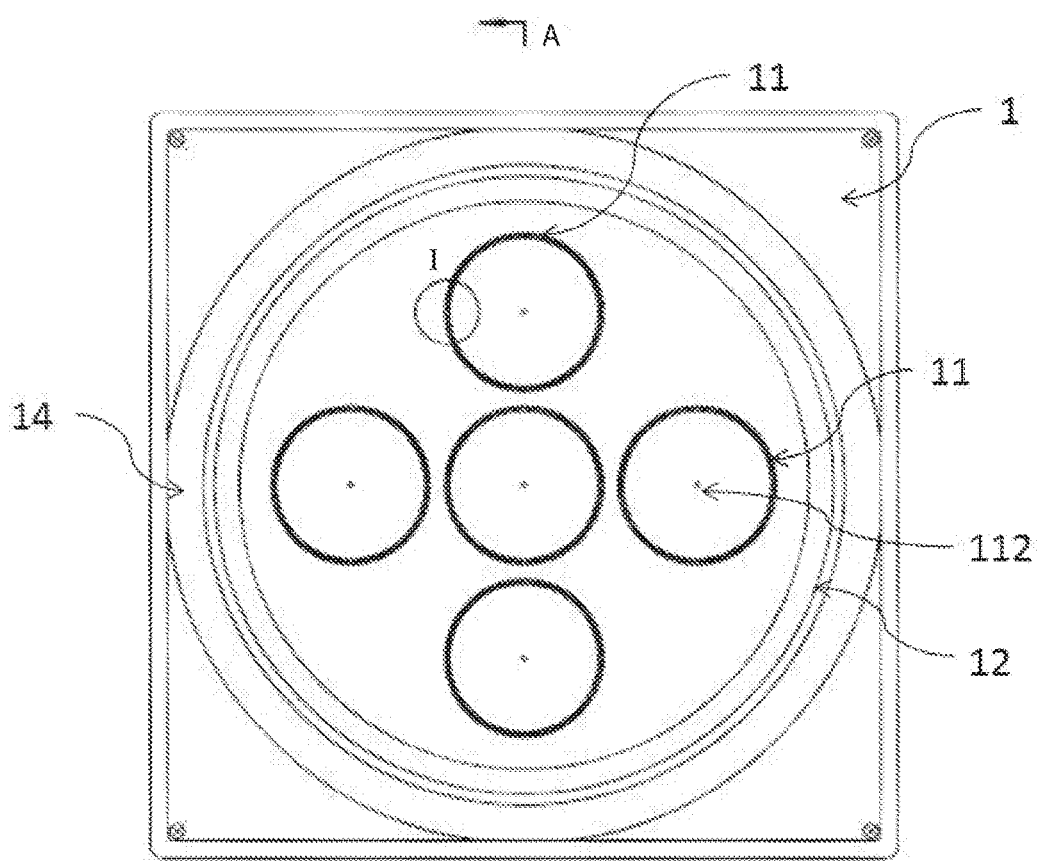
FIG. 11 is a sectional view of a semiconductor processing apparatus according to another embodiment of the present disclosure.
Figure 11A:
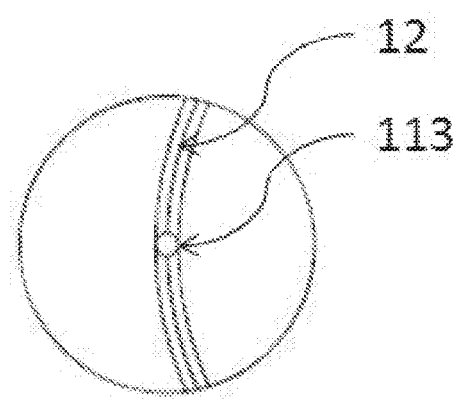
FIG. 11A illustrates a zoom-in view of circle I of FIG. 11.
Figure 11B:
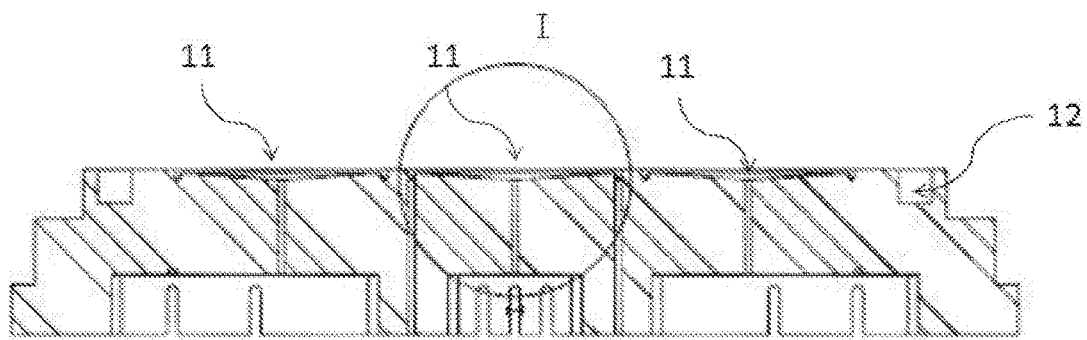
FIG. 11B is a sectional view along sectional line A-A of FIG. 11.
Figure 11C:
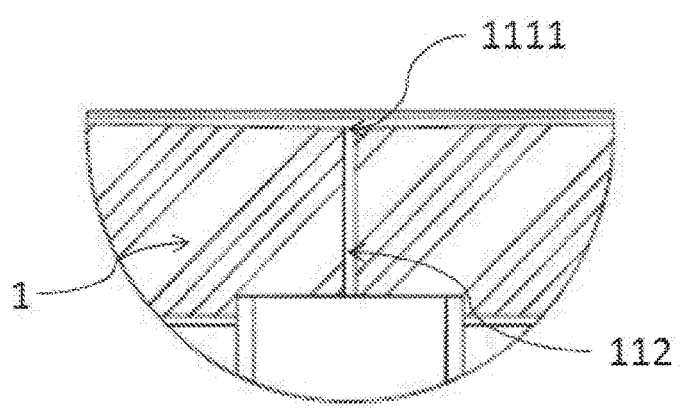
FIG. 11C illustrates a zoom-in view of circle I of FIG. 11B according to an embodiment of the present disclosure.
Figure 11D:
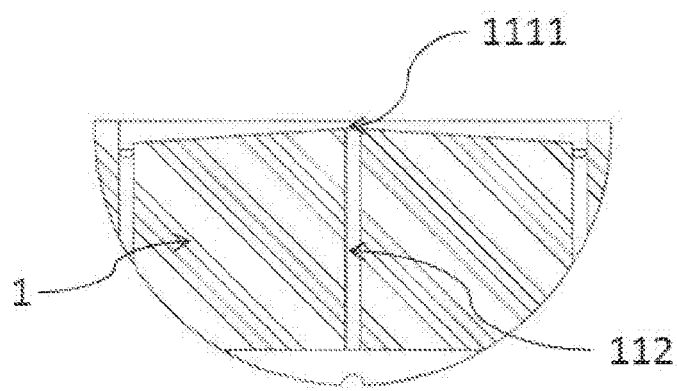
FIG. 11D illustrates a zoom-in view of circle I of FIG. 11B according to another embodiment of the present disclosure.

FIG. 11 is a sectional view of a semiconductor processing apparatus according to another embodiment of the present disclosure. FIG. 11A illustrates a zoom-in view of circle I of FIG. 11, whereas FIG. 11B is a sectional view along sectional line A-A of FIG. 11. FIG. 11C illustrates a zoom-in view of circle I of FIG. 11B according to an embodiment of the present disclosure, and FIG. 11D illustrates a zoom-in view of circle I of FIG. 11B according to another embodiment of the present disclosure. As shown in FIG. 11, body portion 1 may include a plurality of semiconductor processing units 11 that are mutually independent. Each of the plurality of semiconductor processing units 11 may be capable of treating or processing a respective region on a same side of a substrate 4. As shown in FIGS. 11A and 11B, five semiconductor processing units 11 that are mutually independent may be disposed on body portion 1 of the semiconductor processing apparatus. Body portion 1 also may also have a first groove 12 that is disposed on an outer side of all of the plurality of semiconductor processing units 11. First groove 12 may be capable of collecting fluid 3 that may overflow from the plurality of semiconductor processing units 11. Body portion 1 may further include a third channel 13 that is connected to first groove 12. Third channel 13 may be capable of sending or otherwise drain the fluid 3 collected in the first groove 12 to the outside. Each of the plurality of semiconductor processing units 11 may be capable of independently treating a respective region of substrate 4. Namely, during the treatment, fluid 3 in a semiconductor processing unit 11 would not affect other regions of substrate 4. As shown in FIG. 11C, for any one of the plurality of semiconductor processing units 11, location 1111 may be located at the center of the bottom surface of recess 111 of that particular semiconductor processing unit 11. The bottom surface of recess 111 may be a slope that ascends from location 1111 toward peripheral 1112 of the bottom surface against the direction of gravity. Fluid 3 may enter or exit recess 111 via first channel 112, and fluid 3 may also enter or exit recess 111 via second channel 113. In an alternative embodiment, as shown in FIG. 11D, for any one of the plurality of semiconductor processing units 11, the bottom surface of recess 111 may be a slope that descends from location 1111 toward peripheral 1112 of the bottom surface following the direction of gravity. Similarly, fluid 3 may enter or exit recess 111 via first channel 112, and fluid 3 may also enter or exit recess 111 via second channel 113.

The semiconductor processing apparatuses, as disclosed above, may be capable of processing substrates for different purposes, such as cleaning, passivation and inspection of a semiconductor surface. Apparently, the substrates may include other objects of thin slices, such a plate of glass, a plate of plastic or other kinds of plates.

According to another aspect of the present disclosure, a semiconductor processing method is disclosed. The semiconductor processing method may be capable of cleaning a surface of a semiconductor substrate, and/or removing an oxidation layer at the surface of the semiconductor substrate. The semiconductor substrate may be a crystal wafer or a silicon wafer or other semiconductor devices. The semiconductor processing method may include the following steps:

(1) Place a substrate 4 that is to be processed on top of a recess 111 of a body portion 1. Body portion 1 may have a first channel 112 and a second channel 113, each of which may connect to recess 111. An opening of first channel 112 where first channel 112 connects to recess 111 is located at a different height from a height of an opening of second channel 113 where second channel 113 connects to recess 111. In some embodiments, recess 111 may have at least one location 1111 located at a center of a bottom surface of recess 111. The bottom surface may descend from location 1111 toward a peripheral 1112 of the bottom surface following a direction of gravity. The opening of the first channel 112 may be higher than the opening of the second channel 113.

(2) Send a fluid 3 to recess 111 via at least one of first channel 112 and second channel 113. Fluid 3 may fill up a space between a lower surface of substrate 4 and body portion 1. Moreover, fluid 3 may contact the lower surface of substrate 4. In some embodiments, fluid 3 may be one or more of a hydrofluoric acid solution, a nitric acid solution, a hydrogen peroxide and any other kind of fluid that is capable of cleaning the lower surface of substrate 4.

(3) Drain fluid 3 inside recess 111 via one of first channel 112 and second channel 113 that has an opening that is located at a lower location. Meanwhile, send fluid 3 to recess 111 via the other one of first channel 112 and second channel 113, which has an opening that is located at a higher location. During this process, maintain fluid 3 in a state that contacts the lower surface of substrate 4 so that fluid 3 may process the lower surface of substrate 4. In some embodiments, fluid 3 may include a hydrofluoric acid solution and/or a nitric acid solution such that an oxidation layer at the lower surface of substrate 4 may be removed thereby, and the lower surface of substrate 4 may become hydrophobic.

(4) Stop sending fluid 3 to recess 111 via the one of first channel 112 and second channel 113 that has an opening located at a higher location.

(5) Drain fluid 3 inside recess 111 out of recess 111 via one of first channel 112 and second channel 113 that has an opening located at a lower location. A solid-liquid-gas boundary may be formed between fluid 3 and the lower surface of substrate 4. Control a moving speed and a moving direction of the solid-liquid-gas boundary by controlling a flowing speed of fluid 3 as fluid 3 exits recess 111, which subsequently controls an amount and a physical distribution of a residue of fluid 3 at the lower surface of substrate 4.

In an event that the moving speed of the solid-liquid-gas boundary satisfies a first predetermined condition, fluid 3 may leave substantially no residue on the lower surface of substrate 4 as the solid-liquid-gas boundary moves across the lower surface of substrate 4. Specifically, the lower surface of substrate 4 may be hydrophobic, and the solid-liquid-gas boundary between fluid 3 and the lower surface of substrate 4 may move either from a center of substrate 4 to a peripheral of substrate 4, or from the peripheral of substrate 4 to the center of substrate 4. Therefore, as the solid-liquid-gas boundary moves across the lower surface of substrate 4, fluid 3 may leave residue only at a location where fluid 3 is finally separated from substrate 4, and would not leave residue at any other location of substrate 4. That is, in an event that the solid-liquid-gas boundary moves from the peripheral of substrate 4 to the center of substrate 4, the residue of fluid 3, if any, could only appear at the center of substrate 4. Similarly, in an event that the solid-liquid-gas boundary moves from the center of substrate 4 to the peripheral of substrate 4, the residue of fluid 3, if any, could only appear at the peripheral of substrate 4. In either case, residue of fluid 3 would not stay at other locations of substrate 4, thereby ensuring a quality of substrate 4 as the residue may contain contaminants from the cleaning process.

In an event that the moving speed of the solid-liquid-gas boundary satisfies a second predetermined condition, fluid 3 may form a thin film of a predetermined thickness on the lower surface of substrate 4. Specifically, when fluid 3 exits recess 111 at a higher existing speed, the solid-liquid-gas boundary may move faster as fluid 3 and substrate 4 separate from one another. Fluid 3 may thus leave on the lower surface of substrate 4 a layer of residue having the predetermined thickness.

In one aspect of the method according to the present disclosure, a situation of contact between fluid 3 and substrate 4 may be well controlled, thereby controlling a situation of reaction or cleaning of substrate 4 by fluid 3. In another aspect of the method according to the present disclosure, an exiting speed of fluid 3 leaving recess 111 may be well controlled, thereby controlling an amount and a distribution of a residue of fluid 3 left on the lower surface of substrate 4. Specifically, when operating a cleaning process to substrate 4, the residue of fluid 3 may be controlled such that substantially no residue is left on the lower surface of substrate 4 (except for possibly at the center or the peripheral of substrate 4). Alternatively, it may be controlled such that fluid 3 may form a thin film of a predetermined thickness, and the thin film may be used to protect the lower surface of substrate 4. For example, the thin film may prevent the lower surface of substrate 4 from contacting the air and having a reaction with the air.

According to another aspect of the present disclosure, a testing method may be included to test a cleanness of a substrate after the substrate is cleaned using the method disclosed above, as follows:

(1) Place a substrate 4 on top of recess 111 of body portion 1 after adding 20 nanograms (ng) of ionic contaminant of a certain metal. Dispose cover portion 2 on top recess 111 of body portion 1.

(2) Send fluid 3 of a volume of 1.2V into recess 111 via one of first channel 112 and second channel 113 that has an opening located at a higher location. Fluid 3 may be a hydrofluoric acid solution, a nitric acid solution, a hydrogen peroxide or a combination of thereof. Unit "V" above represents a volume of a space between substrate 4 and recess 111. An extra 0.2V of fluid 3 is sent into recess 111 to guarantee fluid 3 may be able to sufficiently clean a lower surface of substrate 4. Fluid 3 of volume 1V that remains in recess 111 may be collected and used to test a situation of remnant contaminants on the lower surface of substrate 4.

(3) Send in ultrapure water of a volume of 20V into recess 111, via one of first channel 112 and second channel 113 that has an opening located at the higher location, to wash substrate 4. Collect fluid 3 and the ultrapure water via one of first channel 112 and second channel 113 that has an opening located at a lower location.

(4) Perform inductively coupled plasma mass spectrometry (ICP-MS) on the fluid 3 and the ultrapure water collected above. Specifically, calculate a result using a standard addition method and add 20 ng of ionic contaminant of certain metal A. For example, ICP-MS may measure an amount of 18 ng of the ionic contaminant. Considering that the extra 0.2V of fluid 3 may also contain some ionic contaminant, a collection rate of the ionic contaminant is thus over 90%. Compared with existing substrate cleaning/washing methods such as wet cleaning techniques that involve chemical immersion and/or spraying, the cleaning method according to the present disclosure achieves prominent cleaning results using an extremely low volume of fluid 3 and ultrapure water. Semiconductor industry consumes large amounts of various fluids and water resources that very much surpass imagination of the general public, causing serious environmental impacts and aggravating scarceness of water resources. The semiconductor cleaning method according to the present application may save a large quantity of fluid 3 and ultrapure water, thereby reducing the impact fluid 3 may bring to the environment.

According to another aspect of the present disclosure, a semiconductor passivation method is proposed. The semiconductor applicable to the method may include crystal wafers, silicon wafers or other semiconductor substrates. The method firstly removes an oxidation layer at a surface of a substrate, and secondly performs passivation to the surface. The method may include the following steps:

(1) Place a substrate 4 that is to be processed on top of a recess 111 of a body portion 1. Dispose cover portion 2 on top recess 111 of body portion 1. In some embodiments, recess 111 may have at least one location 1111, and a bottom surface of recess 111 may descend from location 1111 toward a peripheral 1112 of the bottom surface following a direction of gravity. In some alternative embodiments, the bottom surface of recess 111 may ascend from location 1111 toward the peripheral 1112 of the bottom surface against a direction of gravity. Body portion 1 may have a first channel 112 connecting to recess 111 at location 1111. Body portion 1 may also have a second channel 113 connecting to recess 111 at peripheral 1112 of the bottom surface. One of first channel 112 and second channel 113 may be used to send a fluid into recess 111, whereas the other one of first channel 112 and second channel 113 may be used to drain the fluid out of recess 111. Each of first channel 112 and second channel 113 may connect to recess 111 at an opening, and the opening of first channel 112 may be located at a different height from the opening of second channel 113. In a preferred embodiment, location 1111 may be located at a center of the bottom surface of recess 111. The bottom surface of recess 111 may ascend from location 1111 toward the peripheral 1112 of the bottom surface against a direction of gravity, and may have a cross sectional profile that may be described by a curve represented by a function of $y=-C/x$ or $y=A\cdot \ln(x)+C$, wherein A and C are constants. The opening of the first channel 112 may be lower than the opening of the second channel 113.

(2) Send the fluid to recess 111 via at least one of first channel 112 and second channel 113. The fluid may be capable of removing an oxidation layer at the lower surface of substrate 4. The fluid may fill up a spacing fill up a space between a lower surface of substrate 4 and body portion 1. Moreover, the fluid may contact the lower surface of substrate 4. The fluid may then be drained out of recess 111 via one of first channel 112 and second channel 113, of which the opening is at a lower location. Generally, a hydrofluoric acid solution may be used as the fluid to remove the oxidation layer. Apparently, other types of fluid capable of remove an oxidation layer may be employed. After the oxidation layer is removed from the lower surface of substrate 4, the lower surface of substrate 4 may become hydrophobic. After the fluid has worked to remove the oxidation layer to certain degree, the fluid may be stopped from being sent into recess 111 any further.

(3) In an event that a density of the fluid inside recess 111 reaches a third predetermined condition, ultrapure water may be sent into recess 111 via one first channel 112 and second channel 113 that has an opening at a higher location. The ultrapure water may wash the lower surface of substrate 4 and remove residue of the fluid left thereon. In an event that the density of the fluid inside recess 111 never reaches the third predetermined condition, one may proceed to the next step. This is because if the density of the fluid is lower than the third predetermined condition, it is not necessary to wash the lower surface of substrate 4 and remove residue of the fluid left thereon.

(4) Send passivation substance to recess 111 via either one of first channel 112 and second channel 113. The passivation substance may form a passivation layer on the lower surface of substrate 4. Meanwhile, drain or remove the passivation substance from recess 111 via either one of first channel 112 and second channel 113.

(5) When a passivation requirement is met after a certain amount of passivation substance has been sent to recess 111, stop sending more passivation to recess 111. Whether or not the passivation requirement is met may be judged by the amount of passivation substance that has been sent to recess 111, or by a period of time over which the passivation substance has been sent to recess 111. Apparently, substantially no further passivation may be formed on the lower surface of substrate 4 after a certain degree of passivation has been achieved thereon.

The passivation substance may be gas (such as ozone) or liquid. Obviously, the present method may be applicable to other passivation substances that are being used in existing passivation techniques. The present method requires the passivation substance to be sent into recess 111 only, which would require a very small amount of the passivation substance as compared to various existing techniques, and would result in a more complete and more even passivation result. A testing method may be included to test the passivation after a passivation layer is formed using the method disclosed above, as follows:

(1) Place a substrate 4 that is to be processed on top of a recess 111 of a body portion 1. Dispose cover portion 2 on top recess 111 of body portion 1.

(2) Slowly send 150 milliliter (mL) of hydrofluoric acid solution of 10% mass percentage to recess 111 via either one of first channel 112 and second channel 113, for removing any oxidation layer that may have formed on a surface of substrate 4. Drain the hydrofluoric acid solution inside recess 111 via one of first channel 112 and second channel 113 that has an opening that is located at a lower location.

(3) Slowly send 250 mL of ultrapure water into recess 111 via one of first channel 112 and second channel 113 that has an opening located at a higher location, for washing away residue of the hydrofluoric acid solution left in recess 111. The ultrapure water may be drained via one of first channel 112 and second channel 113 that has an opening located at a lower location. Since the surface of substrate 4 becomes hydrophobic after being treated by the hydrofluoric acid solution, the ultrapure water would not leave residue on the surface of substrate 4 except for a peripheral or a center of substrate 4. Thus, most area of the surface of substrate 4 may be ensured to have a good quality. Moreover, a step for drying water residue of the surface of substrate 4 would not be necessary.

(4) Send ozone gas into recess 111 via either one of first channel 112 and second channel 113, for forming a passivation layer on the surface of substrate 4. Shut off the ozone gas after sending the ozone gas into recess 111 for 10 minutes.

(5) Remove cover portion 2 to get access to recess 111 and remove substrate 4. Inspect the surface of substrate 4 using a film thickness gauge and measure that an average thickness of an oxidation layer on the surface of substrate 4.

For example, the thickness may be 14 angstroms (A), with a standard deviation of 5%. Accordingly, the passivation method according to the present disclosure may obtain an oxidation layer of more even thickness, reducing a probability of having varying thickness in different regions of the surface of substrate 4.

According to another aspect of the present disclosure, a semiconductor surface inspection method is proposed for inspecting a contaminant distribution in different regions of a semiconductor surface. The method may include the following steps:

(1) Place a substrate 4 that is to be inspected on top of a body portion 1 having a plurality of semiconductor processing units 11, with a lower surface of substrate 4 abutting the plurality of semiconductor processing units 11. The plurality of semiconductor processing units 11 may be arranged according to different regions of substrate 4 that are to be inspected. A quantity of semiconductor processing units of the plurality of semiconductor processing units 11 may be determined based on an inspection requirement. For example, the more regions of substrate 4 are to be inspected, a larger quantity of semiconductor processing units 11 may be disposed on body portion 1. The higher the inspection accuracy is required, the higher density at which semiconductor processing units 11 may be disposed on body portion 1 is needed. In an embodiment, a bottom surface of a recess 111 of each of the plurality of semiconductor processing units 11 may have a location 1111 located at a center of the bottom surface of recess 111. The bottom surface may be a slope ascending from location 1111 toward a peripheral 1112 of the bottom surface of recess 111 against a direction of gravity. For each of the plurality of semiconductor processing units 11, body portion 1 may have a first channel 112 connecting to recess 111 at an opening that is at a lower location. Body portion 1 may also have a second channel 113 connecting to recess 111 at an opening that is at a higher location. Each of first channel 112 and second channel 113 may be used to send a fluid 3 into recess 111, to drain fluid 3 out of recess 111, or to keep a balance of pressure. In an alternative embodiment, the bottom surface may be a slope descending from location 1111 toward peripheral 1112 of the bottom surface of recess 111 following a direction of gravity. First channel 112 may thus have the opening at a higher location while second channel 113 may have the opening at a lower location. That is, the opening of the first channel 112 and the opening of the second channel 113 are located at different heights of body portion 1.

(2) Send fluid 3 into the recess 111 of at least one of the plurality of semiconductor processing units 11 via either of first channel 112 and second channel 113 corresponding to the at least one of the plurality of semiconductor processing units 11. Fluid 3 may contact a portion of the lower surface of substrate 4 and take away contaminant thereof. An appropriate kind of fluid 3 may be chosen depending on the kind of contaminant to be inspected. In general, fluid 3 may include a solution such as a hydrofluoric acid solution, a nitric acid solution and/or a hydrogen peroxide solution.

(3) Remove fluid 3 from the recess 111 via either of the first channel 112 and second channel 113. For an embodiment that has a bottom surface of recess 111 that includes a slope ascending from location 1111 toward peripheral 1112 of the bottom surface against the direction of gravity, fluid 3 may enter recess 111 via first channel 112. As fluid 3 continues entering recess 111, fluid 3 may contact the lower surface of substrate 4 and remove or otherwise dissolve substances from the lower surface of substrate 4. As fluid 3 flows inside recess 111, the dissolved substances may move from a center of substrate 4 toward a peripheral of substrate 4. Fluid 3 may subsequently be drained out of recess 111 via first channel 112, and the substances removed from the lower surface of substrate 4 may also be sent out of recess 111 along with fluid 3, subsequently collected and inspected. Since fluid 3 is drained out of first channel 112, which is located at a bottom location of recess 111, fluid 3 may thus flow with a higher stability when exiting recess 111. Alternatively, fluid 3 may exit recess 111 via second channel 113 along with the substances removed from the lower surface of substrate 4, which may then be collected and inspected. Draining fluid 3 via second channel 113 may result in a more stable amount of the substances removed from the lower surface of substrate 4 in the fluid 3 exiting recess 111. This is because as fluid 3 continues entering recess 111 via first channel 112, fluid 3 may gradually fill up recess 111, pushing most of the substances removed from the lower surface of substrate 4 toward peripheral 1112 of the bottom surface of recess 111. The more stable amount of the substances in the fluid 3 exiting recess 111 may be advantageous to inspection of the substances by an instrument.

(4) For an embodiment that has a bottom surface of recess 111 that includes a slope descending from location 1111 toward peripheral 1112 of the bottom surface following the direction of gravity, fluid 3 may enter recess 111 via second channel 113. As fluid 3 continues entering recess 111, fluid 3 may contact the lower surface of substrate 4 and remove or dissolve substances from the lower surface of substrate 4. As fluid 3 flows inside recess 111, the dissolved substances may move from the peripheral of substrate 4 toward the center of substrate 4. Fluid 3 may subsequently be drained out of recess 111 via first channel 112, and the substances removed from the lower surface of substrate 4 may also be sent out of recess 111 along with fluid 3, and subsequently collected and inspected. Draining fluid 3 via first channel 112 may result in a more stable amount of the substances removed from the lower surface of substrate 4 in the fluid 3 exiting recess 111. This is because as fluid 3 continues entering recess 111 via second channel 113, fluid 3 may gradually fill up recess 111, pushing most of the substances removed from the lower surface of substrate 4 toward center 1111 of the bottom surface of recess 111. The more stable amount of the substances in the fluid 3 exiting recess 111 may be advantageous to inspection of the substances by an instrument. Alternatively, fluid 3 may exit recess 111 via second channel 113 along with the substances removed from the lower surface of substrate 4, which may then be collected and inspected. Since fluid 3 is drained out of second channel 113, which is located at a bottom location of recess 111, fluid 3 may thus flow with a higher stability when exiting recess 111.

(5) Collect fluid 3 as drained from each of the plurality of semiconductor processing units 11. Inspect the collected fluid 3 respectively for the substances removed by fluid 3, thereby obtaining a distribution of contaminants in different regions of substrate 4.

The semiconductor surface inspection method described above, as applied to substrate 4, may inspect contaminants in different regions of substrate 4. Each of the plurality of semiconductor processing units 11 may be able to process a respectively one region of substrate 4 independently. During the process, any of the plurality of semiconductor processing units 11 would not affect any other of the plurality of semiconductor processing units 11. Moreover, the fluid used by a semiconductor processing unit 11 would only contact a respective corresponding area of substrate 4, and would not flow to other areas that do not need inspection. This would prevent the fluid from polluting other unrelated areas. Based on inspection results of the plurality of semiconductor processing units 11, a distribution of contaminants in different regions of substrate 4 may be obtained. With a large number of semiconductor processing units 11, each of the semiconductor processing units 11 may be responsible for inspecting only a small area, thereby yielding a more ideal and more truthful distribution of contaminants across the surface of substrate 4.

The present disclosure has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the present disclosure as claimed. Accordingly, the scope of the present disclosure is defined by the appended claims rather than the foregoing description of embodiments.

What is claimed is:

1. A semiconductor processing method, comprising:
   placing a substrate on top of a recess of a body portion with a lower surface of the substrate facing downward for processing, wherein the body portion has a first channel and a second channel each connecting to the recess at a respective opening at a respectively different height;
   sending a fluid to the recess via at least one of the first channel and the second channel such that the fluid fills up a space between the lower surface of the substrate and the recess and contacts the lower surface of the substrate; and
   draining the fluid inside the recess via one of the first channel and the second channel that has the respective opening located at a lower location and comprises controlling a moving speed and a moving direction of a solid-liquid-gas boundary formed between the fluid and the lower surface of the substrate, thereby controlling an amount and a physical distribution of a residue of the fluid at the lower surface of the substrate.

2. The semiconductor processing method of claim 1, wherein, when the moving speed of the solid-liquid-gas boundary satisfies a first predetermined condition, the fluid leaves substantially no residue on the lower surface of the substrate as the solid-liquid-gas boundary moves across the lower surface of the substrate.

3. The semiconductor processing method of claim 2, wherein, when the moving speed of the solid-liquid-gas boundary satisfies a second predetermined condition, the fluid forms a thin film of a predetermined thickness on the lower surface of the substrate as the solid-liquid-gas boundary moves across the lower surface of the substrate.

4. The semiconductor processing method of claim 1, wherein a bottom surface of the recess descends from a center of the bottom surface toward a peripheral of the bottom surface following a direction of gravity, wherein the first channel has the respective opening at a higher location, and wherein the second channel has the respective opening at a lower location.

5. The semiconductor processing method of claim 4, wherein, during the draining of the fluid inside the recess, a solid-liquid-gas boundary formed between the fluid and the lower surface of the substrate moves from the center of the bottom surface toward the peripheral of the bottom surface.

6. The semiconductor processing method of claim 1, wherein a bottom surface of the recess ascends from a center of the bottom surface toward a peripheral of the bottom surface against a direction of gravity, wherein the first channel has the respective opening at a lower location, and wherein the second channel has the respective opening at a higher location.

7. The semiconductor processing method of claim 6, wherein, during the draining of the fluid inside the recess, a solid-liquid-gas boundary formed between the fluid and the lower surface of the substrate moves from the peripheral of the bottom surface toward the center of the bottom surface.

8. A semiconductor surface inspection method, comprising:
   placing a substrate on top of a body portion such that each of a plurality of semiconductor processing units abuts a lower surface of the substrate;
   sending a fluid to at least one unit of the plurality of semiconductor processing units via either one of a first channel and a second channel of the at least one unit such that the fluid contacts the lower surface of the substrate and removes or dissolves a contaminant at the lower surface of the substrate;
   draining the fluid via either one of the first channel and the second channel; and
   respectively collecting and inspecting the fluid drained from the at least one unit to obtain a distribution of the contaminant in different regions of the substrate.

9. The semiconductor surface inspection method of claim 8, wherein a bottom surface of a recess of each of the plurality of semiconductor processing units ascends from a center of the bottom surface toward a peripheral of the bottom surface against a direction of gravity, wherein the first channel has a respective opening at a lower location, and wherein the second channel has a respective opening at a higher location.

10. The semiconductor surface inspection method of claim 9, wherein the draining of the fluid comprises draining the fluid via the first channel, and wherein the contaminant removed or dissolved in the fluid moves from the center to the peripheral as the fluid flows in the recess.

11. The semiconductor surface inspection method of claim 10, wherein the draining of the fluid comprises draining the fluid via the first channel, and wherein the contaminant removed or dissolved in the fluid is drained out of the recess along with the fluid and subsequently collected for inspection.

12. The semiconductor surface inspection method of claim 10, wherein the draining of the fluid comprises draining the fluid via the second channel, and wherein the contaminant as removed or dissolved in the fluid is drained out of the recess along with the fluid and subsequently collected for inspection.

13. The semiconductor surface inspection method of claim 8, wherein a bottom surface of a recess of each of the plurality of semiconductor processing units descends from a center of the bottom surface toward a peripheral of the bottom surface following a direction of gravity, wherein the first channel has a respective opening at a higher location, and wherein the second channel has a respective opening at a lower location.

14. The semiconductor surface inspection method of claim 13, wherein the draining of the fluid comprises draining the fluid via the second channel, and wherein the contaminant as removed or dissolved in the fluid moves from the peripheral to the center as the fluid flows in the recess.

15. The semiconductor surface inspection method of claim 14, wherein the draining of the fluid comprises draining the fluid via the first channel, and wherein the contaminant as removed or dissolved in the fluid is drained out of the recess along with the fluid and subsequently collected for inspection.

16. The semiconductor surface inspection method of claim 14, wherein the draining of the fluid comprises draining the fluid via the second channel, and wherein the contaminant as removed or dissolved in the fluid is drained out of the recess along with the fluid and subsequently collected for inspection.

\* \* \* \* \*